(12) United States Patent
Chang et al.

(10) Patent No.: US 12,520,545 B2
(45) Date of Patent: Jan. 6, 2026

(54) SEMICONDUCTOR DEVICE WITH OFFSET SOURCE/DRAIN REGIONS AND METHODS OF FORMATION

(71) Applicant: Taiwan Semiconductor Manufacturing Company, Ltd., Hsinchu (TW)

(72) Inventors: Cheng-Wei Chang, Taipei (TW); Shahaji B. More, Hsinchu (TW); Lun-Kuang Tan, Hsinshu (TW); Chi-Yu Chou, Zhubei (TW); Yueh-Ching Pai, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 670 days.

(21) Appl. No.: 17/814,056

(22) Filed: Jul. 21, 2022

(65) Prior Publication Data
US 2023/0369395 A1 Nov. 16, 2023

Related U.S. Application Data

(60) Provisional application No. 63/364,434, filed on May 10, 2022.

(51) Int. Cl.
*H10D 84/85* (2025.01)
*H10D 30/01* (2025.01)
(Continued)

(52) U.S. Cl.
CPC ........ *H10D 62/121* (2025.01); *H10D 30/014* (2025.01); *H10D 30/43* (2025.01); *H10D 30/6735* (2025.01); *H10D 30/6755* (2025.01); *H10D 30/6757* (2025.01); *H10D 62/151* (2025.01); *H10D 64/017* (2025.01); *H10D 84/0167* (2025.01); *H10D 84/017* (2025.01); *H10D 84/0188* (2025.01);
(Continued)

(58) Field of Classification Search
None
See application file for complete search history.

(56) References Cited

U.S. PATENT DOCUMENTS

| 2015/0048456 A1* | 2/2015 | Chuang | H10D 84/85 |
| | | | 438/585 |
| 2021/0202465 A1* | 7/2021 | Wang | H10D 30/031 |

(Continued)

*Primary Examiner* — Nicholas J Tobergte
*Assistant Examiner* — William Henry Anderson
(74) *Attorney, Agent, or Firm* — Harrity & Harrity, LLP

(57) ABSTRACT

Nanostructure transistors are formed in a manner that may reduce the likelihood of source/drain region merging in the nanostructure transistors. In a top-down view of a nanostructure transistor described herein, source/drain regions on opposing sides of a nanostructure channel of the nanostructure transistor are staggered such that the distance between the source/drain regions is increased. This reduces the likelihood of the source/drain regions merging, which reduces the likelihood of failures and/or other defects forming in the nanostructure transistor. Accordingly, staggering the source/drain regions, as described herein, may facilitate the miniaturization of semiconductor devices that include nanostructure transistors while maintaining and/or increasing the semiconductor device yield of the semiconductor devices.

20 Claims, 21 Drawing Sheets

(51) Int. Cl.
*H10D 30/43* (2025.01)
*H10D 30/67* (2025.01)
*H10D 62/10* (2025.01)
*H10D 62/13* (2025.01)
*H10D 64/01* (2025.01)
*H10D 84/01* (2025.01)
*H10D 84/03* (2025.01)
*H10D 89/10* (2025.01)

(52) U.S. Cl.
CPC ........... *H10D 84/038* (2025.01); *H10D 84/85* (2025.01); *H10D 89/10* (2025.01)

(56) References Cited

U.S. PATENT DOCUMENTS

| | | | |
|---|---|---|---|
| 2021/0296318 A1* | 9/2021 | Wang | H10D 62/121 |
| 2021/0408048 A1* | 12/2021 | Wang | H10B 43/20 |
| 2023/0178440 A1* | 6/2023 | He | H10D 84/013 |

* cited by examiner

SEMICONDUCTOR DEVICE WITH OFFSET SOURCE/DRAIN REGIONS AND METHODS OF FORMATION

CROSS-REFERENCE TO RELATED APPLICATION

This Patent Application claims priority to U.S. Provisional Patent Application No. 63/364,434, filed on May 10, 2022, and entitled "SEMICONDUCTOR DEVICE AND METHODS OF FORMATION." The disclosure of the prior Application is considered part of and is incorporated by reference into this Patent Application.

BACKGROUND

As semiconductor device manufacturing advances and technology processing nodes decrease in size, transistors may become affected by short channel effects (SCEs) such as hot carrier degradation, barrier lowering, and quantum confinement, among other examples. In addition, as the gate length of a transistor is reduced for smaller technology nodes, source/drain (S/D) electron tunneling increases, which increases the off current for the transistor (the current that flows through the channel of the transistor when the transistor is in an off configuration). Silicon (Si)/silicon germanium (SiGe) nanostructure transistors such as nanowires, nanosheets, and gate-all-around (GAA) devices are potential candidates to overcome short channel effects at smaller technology nodes. Nanostructure transistors are efficient structures that may experience reduced SCEs and enhanced carrier mobility relative to other types of transistors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
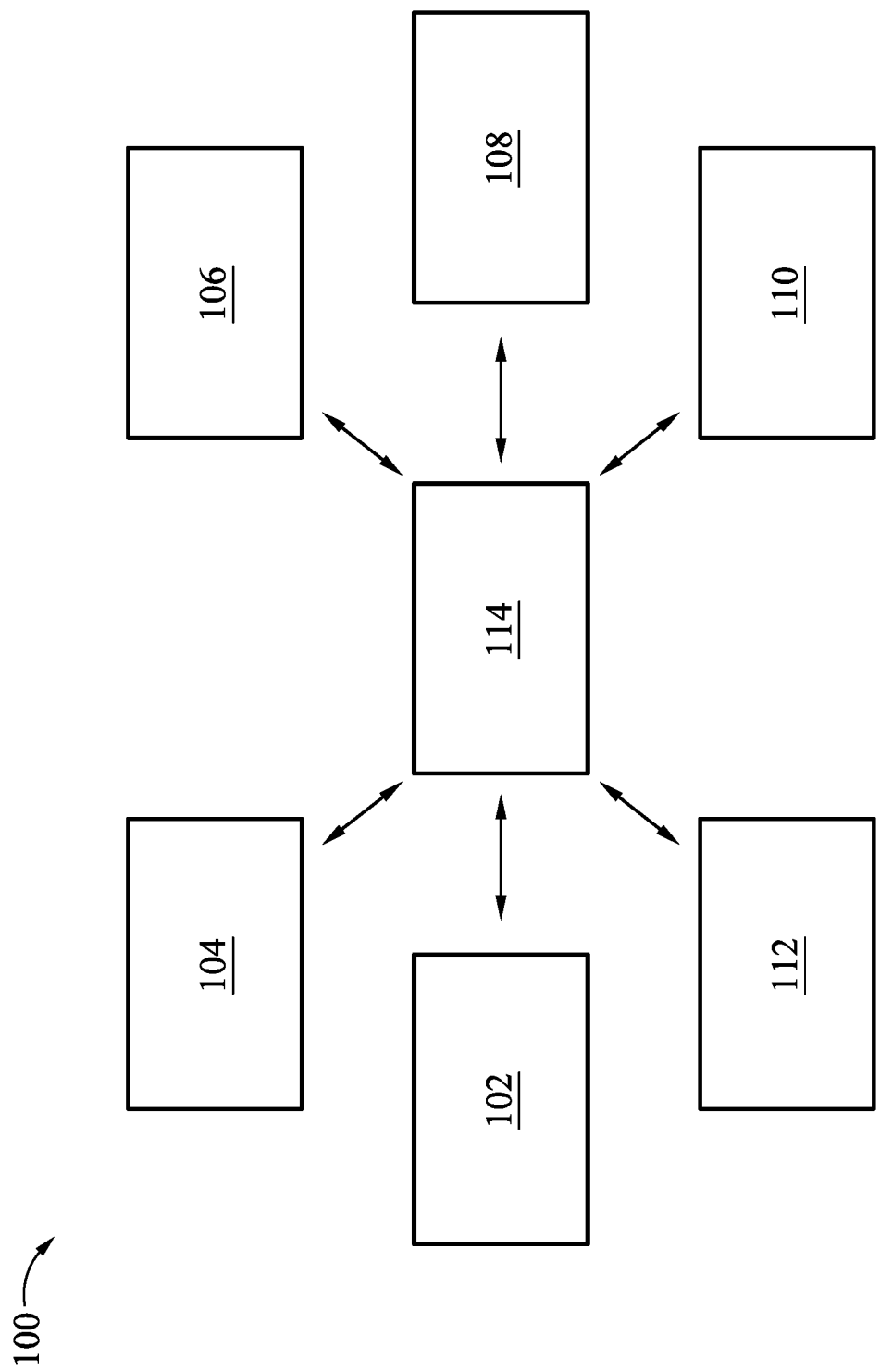
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some cases, reducing geometric and dimensional properties of a fin field-effect transistor (finFET) may decrease a performance of the finFET. As an example, a likelihood of short channel effects such as drain-induced barrier lowering in a finFET may increase as finFET technology processing nodes decrease. Additionally or alternatively, a likelihood of electron tunneling and leakage in a finFET may increase as a gate length of the finFET decreases.

Nanostructure transistors (e.g., nanowire transistors, nanosheet transistors, gate-all-around (GAA) transistors, multi-bridge channel transistors, nanoribbon transistors, and/or other types of nanostructure transistors) may overcome one or more of the above-described drawbacks of finFETs. However, nanostructure transistors face fabrication challenges that can cause performance issues and/or device failures.

For example, semiconductor device yield is one challenge in nanostructure transistor manufacturing. The miniaturization of semiconductor devices, such as complementary metal oxide semiconductor (CMOS) devices and other types of semiconductor devices that include nanostructure transistors, may enable greater semiconductor device yield to be achieved on a single wafer. However, as the size of nanostructure transistors is reduced to support the miniaturization of semiconductor devices, increased defect rates can occur due to the merging of two or more structures in a nanostructure transistor and/or in adjacent nanostructure transistors. As an example, source/drain regions in a nanostructure transistor and/or in adjacent nanostructure transistors can merge, where the source/drain regions become physically connected. This may result in electrical shorting in a nanostructure transistor and/or in adjacent nanostructure transistors, which may result in semiconductor device failures and reduced semiconductor device yield.

Some implementations described herein provide semiconductor devices and methods of formation that may reduce the likelihood of source/drain region merging in a nanostructure transistor. A source/drain region may refer to a source or a drain, individually or collectively dependent upon the context. In a top-down view of a nanostructure transistor described herein, source/drain regions on opposing sides of a nanostructure channel of the nanostructure transistor are staggered such that the distance between the source/drain regions is increased. This reduces the likelihood of the source/drain regions merging, which reduces the likelihood of failures and/or other defects forming in the nanostructure transistor. Accordingly, staggering the source/drain regions, as described herein, may facilitate the miniaturization of semiconductor devices that include nanostructure transistors while maintaining and/or increasing the semiconductor device yield of the semiconductor devices.

FIG. 1 is a diagram of an example environment 100 in which systems and/or methods described herein may be implemented. As shown in FIG. 1, the example environment 100 may include a plurality of semiconductor processing tools 102-112 and a wafer/die transport tool 114. The plurality of semiconductor processing tools 102-112 may include a deposition tool 102, an exposure tool 104, a developer tool 106, an etch tool 108, a planarization tool 110, a plating tool 112, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, a low-pressure CVD (LPCVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the deposition tool 102 includes an epitaxial tool that is configured to form layers and/or regions of a device by epitaxial growth. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that can be filled with an etchant, and the substrate is placed in the chamber for a particular time period to remove particular amounts of one or more portions of the substrate. In some implementations, the etch tool 108 etches one or more portions of the substrate using a plasma etch or a plasma-assisted etch, which may involve using an ionized gas to isotropically or directionally etch the one or more portions. In some implementations, the etch tool 108 includes a plasma-based asher to remove a photoresist material and/or another material.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

Wafer/die transport tool 114 includes a mobile robot, a robot arm, a tram or rail car, an overhead hoist transport (OHT) system, an automated materially handling system (AMHS), and/or another type of device that is configured to transport substrates and/or semiconductor devices between semiconductor processing tools 102-112, that is configured to transport substrates and/or semiconductor devices between processing chambers of the same semiconductor processing tool, and/or that is configured to transport substrates and/or semiconductor devices to and from other locations such as a wafer rack, a storage room, and/or the like. In some implementations, wafer/die transport tool 114 may be a programmed device that is configured to travel a particular path and/or may operate semi-autonomously or autonomously. In some implementations, the example environment 100 includes a plurality of wafer/die transport tools 114.

For example, the wafer/die transport tool 114 may be included in a cluster tool or another type of tool that includes a plurality of processing chambers, and may be configured to transport substrates and/or semiconductor devices between the plurality of processing chambers, to transport substrates and/or semiconductor devices between a processing chamber and a buffer area, to transport substrates and/or semiconductor devices between a processing chamber and an interface tool such as an equipment front end module (EFEM), and/or to transport substrates and/or semiconductor devices between a processing chamber and a transport carrier (e.g., a front opening unified pod (FOUP)), among other examples. In some implementations, a wafer/die transport tool 114 may be included in a multi-chamber (or cluster) deposition tool 102, which may include a pre-clean processing chamber (e.g., for cleaning or removing oxides, oxidation, and/or other types of contamination or byproducts from a substrate and/or semiconductor device) and a plurality of types of deposition processing chambers (e.g., processing chambers for depositing different types of materials, processing chambers for performing different types of deposition operations). In these implementations, the wafer/die transport tool 114 is configured to transport substrates and/or semiconductor devices between the processing chambers of the deposition tool 102 without breaking or removing a vacuum (or an at least partial vacuum) between the processing chambers and/or between processing operations in the deposition tool 102, as described herein.

As described herein, the semiconductor processing tools 102-112 may perform a combination of operations to form one or more portions of a nanostructure transistor. In some implementations, the semiconductor processing tools 102-112 may form a plurality of channel layers arranged in a first direction over a semiconductor substrate of a semiconductor device; may form a first source/drain region adjacent to a first side of the plurality of channel layers; may form a second source/drain region adjacent to a second side of the plurality of channel layers that opposes the first side in a second direction that is approximately perpendicular with the first direction, where, in a top-down view of the semiconductor device, the first side and the second side are offset by a distance, in a third direction in the semiconductor device that is approximately perpendicular with the first direction and the second direction; and/or may form a gate structure wrapping around each of the plurality of channel layers.

In some implementations, the semiconductor processing tools 102-112 may form an n-type metal oxide semiconductor (NMOS) active region including a first plurality of nanosheet layers over a semiconductor substrate of a semiconductor device; may form a p-type metal oxide semiconductor (PMOS) active region including a second plurality of nanosheet layers over the semiconductor substrate; may form an isolation region, between the NMOS active region and the PMOS active region, that includes a third plurality of nanosheet layers over the semiconductor substrate; and may form respective gate structures wrapping around each of the first plurality of nanosheet layers, the second plurality of nanosheet layers, and the third plurality of nanosheet layers, where, in a top-down view of the semiconductor device, the third plurality of nanosheet layers are curved between the NMOS region and the PMOS region.

In some implementations, the semiconductor processing tools 102-112 may form a nanosheet stack that includes a first plurality of nanosheets and a second plurality of nanosheets alternating with the first plurality of nanosheets; may form, in the nanosheet stack, a first semiconductor device region, a second semiconductor device region, and a transition region that extends between the first semiconductor device region and the second semiconductor device region along a first direction in a top-down view of a semiconductor device, where the first and second semiconductor device regions are staggered along a second direction, in a top-down view of the semiconductor device, that is approximately perpendicular with the first direction; may form a dummy gate structure over the transition region; may form an NMOS source/drain region in the first semiconductor device region in the nanosheet stack; and/or may form a PMOS source/drain region in the second semiconductor device region in the nanosheet stack.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of the example environment 100 may perform one or more functions described as being performed by another set of devices of the example environment 100.

Figure 2:
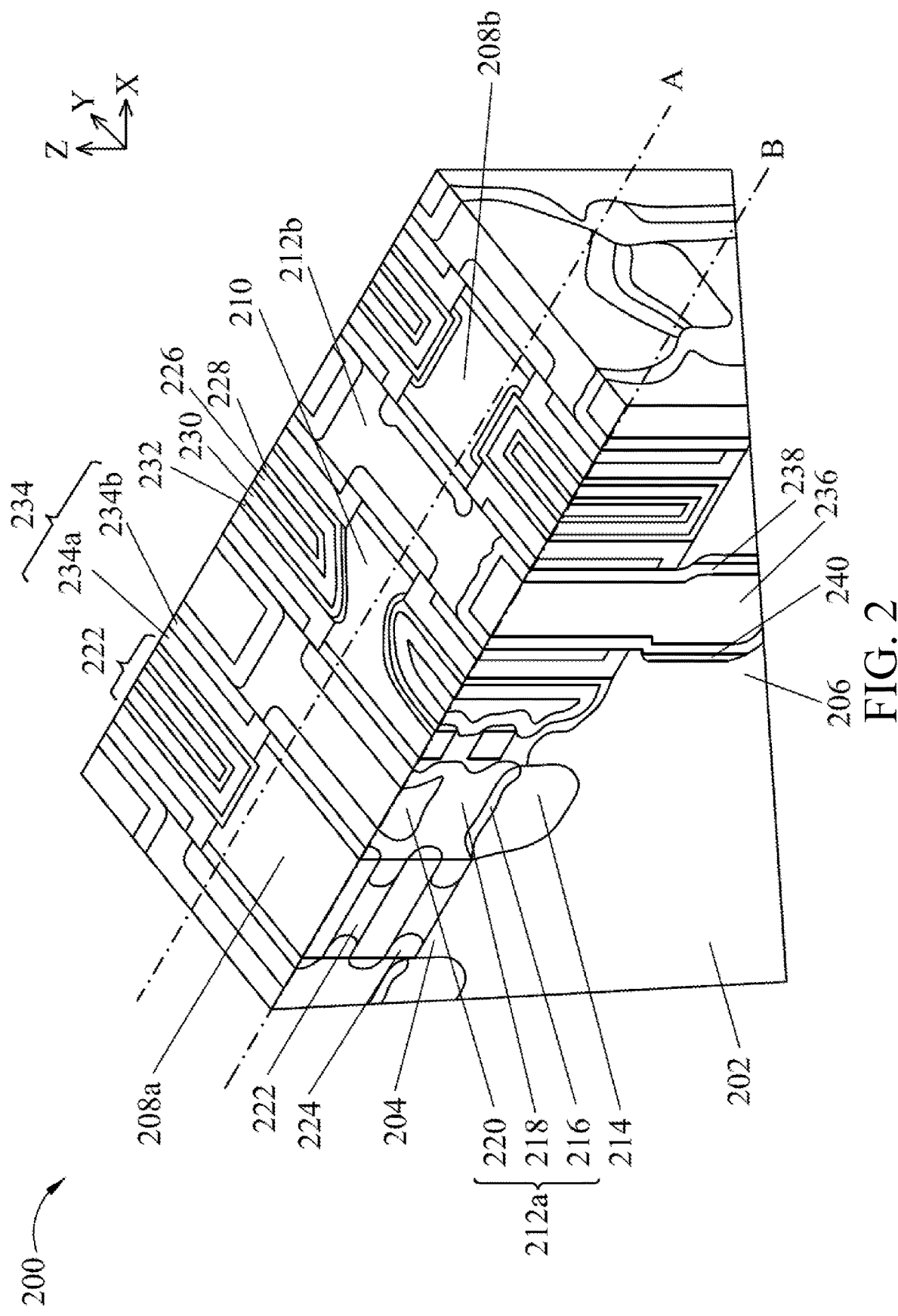
FIG. 2 is a diagram of an example semiconductor device described herein.

FIG. 2 is a diagram of an example semiconductor device 200 described herein. The semiconductor device may include a logic device (e.g., a processor, a central processing unit (CPU) core, a graphics processing unit (GPU) core), a memory device (e.g., a static random access memory (SRAM) device), an input/output (I/O) device, and/or another type of semiconductor device 200.

The semiconductor device 200 includes one or more transistors. The one or more transistors may include nanostructure transistor(s) such as nanowire transistors, nanosheet transistors, gate-all-around (GAA) transistors, multi-bridge channel transistors, nanoribbon transistors, and/or other types of nanostructure transistors. The semiconductor device 200 may include one or more additional devices, structures, and/or layers not shown in FIG. 2. For example, the semiconductor device 200 may include additional layers and/or dies formed on layers above and/or below the portion of the semiconductor device 200 shown in FIG. 2. Additionally, or alternatively, one or more additional semiconductor structures and/or semiconductor devices may be formed in a same layer of an electronic device or integrated circuit (IC) that includes the semiconductor device as the semiconductor device 200 shown in FIG. 2.

As shown in FIG. 2, the layers and/or structures of the semiconductor device 200 may be described in reference to one or more directions or axes. For example, an X-direction may correspond to an approximately horizontal direction in the semiconductor device 200. A Y-direction may correspond to an approximately horizontal direction that is approximately perpendicular with the X-direction. A Z-direction may correspond to an approximately vertical direction in the semiconductor device 200. The Z-direction may be approximately perpendicular with the X-direction and the Y-direction. FIGS. 5A, 5B, 6A-6F, 7, 8A, and 8B, and 9 may include schematic cross-sectional views of various portions of the semiconductor device 200 along one or more cross-sectional planes illustrated in FIG. 2. For example, one or more cross-sectional views of the semiconductor device 200 may be illustrated along a cross-sectional plane A-A illustrated in FIG. 2. The cross-sectional plane A-A may be in and/or along the X-direction. As another example, one or more cross-sectional views of the semiconductor device 200 may be illustrated along a cross-sectional plane B-B illustrated in FIG. 2. The cross-sectional plane B-B may be in and/or along the X-direction. The cross-sectional plane A-A and the cross-sectional plane B-B may be located in different Y-direction positions in the semiconductor device 200.

FIG. 2 illustrates a portion of the layers and/or structures of the semiconductor device that are viewable in the cross-sectional plane B-B. As shown in FIG. 2, the semiconductor device 200 includes a semiconductor substrate 202. The semiconductor substrate 202 includes a silicon (Si) substrate, a substrate formed of a material including silicon, a III-V compound semiconductor material substrate such as gallium arsenide (GaAs), a silicon on insulator (SOI) substrate, a germanium (Ge) substrate, a silicon germanium (SiGe) substrate, a silicon carbide (SiC) substrate, or another type of semiconductor substrate. The semiconductor substrate 202 may include various layers, including conductive or insulating layers formed on a semiconductor substrate. The semiconductor substrate 202 may include a compound semiconductor and/or an alloy semiconductor. The semiconductor substrate 202 may include various doping configurations to satisfy one or more design parameters. For example, different doping profiles (e.g., n-wells, p-wells) may be formed on the semiconductor substrate 202 in regions designed for different device types (e.g., p-type metal-oxide semiconductor (PMOS) nanostructure transistors, n-type metal-oxide semiconductor (NMOS) nanostructure transistors). The suitable doping may include ion implantation of dopants and/or diffusion processes. Further, the semiconductor substrate 202 may include an epitaxial layer (epi-layer), may be strained for performance enhancement, and/or may have other suitable enhancement features. The semiconductor substrate 202 may include a portion of a semiconductor wafer on which other semiconductor devices are formed.

Mesa regions 204 are included above (and/or extend above) the semiconductor substrate 202. A mesa region 204 may also be referred to as a nanostructure pillar, and may provide a structure on which nanostructures of the semiconductor device 200 are formed, such as nanostructure channels, nanostructure gate portions that wrap around each of the nanostructure channels, and/or sacrificial nanostructures, among other examples. In some implementations, one or more mesa regions 204 are formed in and/or from a fin structure (e.g., a silicon fin structure) that is formed in the semiconductor substrate 202. The mesa regions 204 may include the same material as the semiconductor substrate 202 and are formed from the semiconductor substrate 202. In some implementations, the mesa regions 204 are doped to form different types of nanostructure transistors, such as p-type nanostructure transistors and/or n-type nanostructure transistors. In some implementations, the mesa regions 204 include silicon (Si) materials or another elementary semiconductor material such as germanium (Ge). In some implementations, the mesa regions 204 include an alloy semiconductor material such as silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), gallium indium arsenide phosphide (GaInAsP), or a combination thereof.

The mesa regions 204 are fabricated by suitable semiconductor process techniques, such as masking, photolithography, and/or etch processes, among other examples. As an example, fin structures may be formed by etching a portion of the semiconductor substrate 202 away to form recesses in the semiconductor substrate 202. The recesses may then be filled with isolating material that is recessed or etched back to form shallow trench isolation (STI) regions 206 above the semiconductor substrate 202 and between the fin structures. Source/drain recesses may be formed in the fin structures, which results in formation of the mesa regions 204 between the source/drain recesses. However, other fabrication techniques for the STI regions 206 and/or for the mesa regions 204 may be used.

The STI regions 206 may electrically isolate adjacent mesa region 204 and may provide a layer on which other layers and/or structures of the semiconductor device 200 are formed. The STI regions 206 may include a dielectric material such as a silicon oxide ($SiO_x$), a silicon nitride ($Si_xN_y$), a silicon oxynitride (SiON), fluoride-doped silicate glass (FSG), a low-k dielectric material, and/or another suitable insulating material. The STI regions 206 may include a multi-layer structure, for example, having one or more liner layers.

The semiconductor device 200 may include a CMOS-based device that includes NMOS active regions 208a and PMOS active regions 208b. NMOS active regions 208a and PMOS active regions 208b may be used for logic, memory, and/or another type of semiconductor technology in the semiconductor device 200. In some implementations, an NMOS active region 208a may be included adjacent to (or next to) a PMOS active region 208b in the semiconductor device 200, and/or a PMOS active region 208b may be included adjacent to (or next to) an NMOS active region 208a in the semiconductor device 200. An NMOS active region 208a and a PMOS active region 208b may be electrically isolated by an isolation region 210 between the NMOS active region 208a and the PMOS active region 208b.

An "active region" (also referred to as an operation domain (OD)) refers to a portion of the semiconductor device 200 that is electrically active when the semiconductor device 200 is in operation. For example, an NMOS active region 208a may include a plurality of nanostructure channels (or channel regions) that extend between, and are electrically coupled with, one or more NMOS source/drain regions 212a. The nano-structure channels of the NMOS active region 208a provide channels between the NMOS source/drain regions 212a through which an electrical current may selectively flow. The nanostructure channels or nanosheet layers of the NMOS active region 208a are arranged in a direction (e.g., the Z-direction) that is approximately perpendicular to the semiconductor substrate 202. In other words, the nanostructure channels or nanosheet layers of the NMOS active region 208a are vertically arranged or stacked above the semiconductor substrate 202 and over a mesa region 204.

As another example, a PMOS active region 208b may include a plurality of nanostructure channels (or channel regions) that extend between, and are electrically coupled with, one or more PMOS source/drain regions 212b. The nano-structure channels of the PMOS active region 208b provide channels between the PMOS source/drain regions 212b through which an electrical current may selectively flow. The nanostructure channels or nanosheet layers of the PMOS active region 208b are arranged in a direction (e.g., the Z-direction) that is approximately perpendicular to the semiconductor substrate 202. In other words, the nanostructure channels or nanosheet layers of the PMOS active region 208b are vertically arranged or stacked above the semiconductor substrate 202 and over a mesa region 204.

The isolation region 210 may also be referred to as an OD connection region or as an OD-to-OD connection. The isolation region 210 may include a similar composition of layers and/or structures as the NMOS active regions 208a and/or the PMOS active regions 208b. For example, the isolation region 210 may include a plurality of nanosheet layers or channel layers that are arranged in a direction (e.g., the Z-direction) that is approximately perpendicular to the semiconductor substrate 202. The plurality of nanosheet layers or channel layers may extend between an NMOS source/drain region 212a and a PMOS source/drain region 212b.

While the isolation region 210 includes a similar composition of layers and/or structures as the NMOS active regions 208a and/or the PMOS active regions 208b (which reduces the fabrication complexity of forming the semiconductor device 200), the isolation region 210 includes a region in the semiconductor device 200 that is not electrically active. In other words, the isolation region 210 is not electrically connected to signal lines or other metallization layers in the semiconductor device 200. Instead, the isolation region 210 is configured to provide electrical isolation between the NMOS active region 208a and the PMOS active region 208b. The electrical isolation may reduce noise between the NMOS active region 208a and the PMOS active region 208b, may reduce current leakage between the NMOS active region 208a and the PMOS active region 208b, may reduce parasitic capacitance between the NMOS active region 208a and the PMOS active region 208b, and/or may reduce another type of undesirable electrical effect in the semiconductor device 200.

The nanostructure channels of the NMOS active regions 208a and the nanostructure channels of the PMOS active regions 208b include silicon-based nanostructures (e.g., nanosheets or nanowires, among other examples) that function as the semiconductive channels of the nanostructure transistor(s) of the semiconductor device 200. In some implementations, the NMOS active regions 208a and/or the PMOS active regions 208b (or the nanostructure channels included therein) may include silicon (Si) or another silicon-based material. Similarly, the isolation region 210 may include silicon (Si) or another silicon-based material, and may be formed by the same or similar processes as the NMOS active regions 208a and/or the PMOS active regions 208b.

The NMOS source/drain regions 212a and the PMOS source/drain regions 212b may include silicon (Si) with one or more dopants, such as a p-type material (e.g., boron (B) or germanium (Ge), among other examples), an n-type material (e.g., phosphorous (P) or arsenic (As), among other examples), and/or another type of dopant. The NMOS source/drain regions 212a may refer to the source regions and/or the drain regions of the NMOS nanostructure transistors of the semiconductor device 200.

In some implementations, an epitaxial region 214 may be included under an NMOS source/drain region 212a between the NMOS source/drain region 212a and a fin structure above the semiconductor substrate 202. An epitaxial region 214 may sometimes be referred to as an L0 region of the NMOS source/drain region 212a. An epitaxial region 214 may provide isolation between an NMOS source/drain region 212a and adjacent mesa regions 204. An epitaxial region 214 may be included to reduce, minimize, and/or prevent electrons from traversing into the mesa regions 204 (e.g., instead of through the nanostructure channels of an NMOS active region 208a, thereby reducing current leakage), and/or may be included to reduce, minimize and/or prevent dopants from the NMOS source/drain region 212a into the mesa regions 204 (which reduces short channel effects). Similarly, an epitaxial region 214 may be included under a PMOS source/drain region 212b between the PMOS source/drain region 212b and a fin structure above the semiconductor substrate 202. The epitaxial regions 214 of the semiconductor device 200 may include epitaxially grown material, such silicon (Si), silicon doped with one or more types of dopants, and/or another epitaxially grown material.

An NMOS source/drain region 212a may include a buffer layer 216 (sometimes referred to as a seed layer), an epitaxial layer 218 (sometimes referred to as an L1 epitaxial layer), and an epitaxial layer 220 (sometimes referred to as an L2 epitaxial layer). The buffer layer 216 may be included over and/or on an epitaxial region 214, and over and/or on ends of nanostructure channels of NMOS active regions 208a adjoining the NMOS source/drain region 212a. In some implementations, if the NMOS source/drain region 212a is adjacent to or next to the isolation region 210, portions of the buffer layer 216 may be included over and/or on ends of the nanostructure layers of the isolation region 210. The buffer layer may function as a seed layer for the epitaxial layer 218 because the silicon germanium (SiGe) of the epitaxial layer 218 may be unable to grow on portions of the nanosheet layers in the NMOS active region 208a.

The epitaxial layer 218 may be included over and/or on the buffer layer 216. The epitaxial layer 220 may be included over and/or on the epitaxial layer 218. One or more PMOS source/drain regions 212b of the semiconductor device 200 may include a similar configuration of a buffer layer 216, an epitaxial layer 218, and/or an epitaxial layer 220.

A buffer layer 216 may include a silicon nitride ($Si_xN_y$), silicon (Si), epitaxially grown silicon, silicon doped with one or more types of dopants, and/or another suitable material. An epitaxial layer 218 may include, as an example, a silicon-germanium material doped with boron (e.g., SiGe: B). In such a case, the doping concentration of boron may be included in a range of approximately $1 \times 10^{20}$ atoms per cubic centimeter to approximately $8 \times 10^{20}$ atoms per cubic centimeter. Additionally, or alternatively, a content of germanium in the epitaxial layer 218 may be included in a range of approximately 15% to approximately 35%. However, other combinations of materials, dopants, doping concentrations, and compositions (e.g., content of germanium, among other examples) in the epitaxial layer 218 are within the scope of the present disclosure.

An epitaxial layer 220 may include, as an example, a silicon-germanium material doped with boron (e.g., SiGe: B). In such a case, the doping concentration of boron may be included in a range of approximately $8 \times 10^{20}$ atoms per cubic centimeter to approximately $3 \times 10^{21}$ atoms per cubic centimeter. However, other combinations of dopants and values/ranges for doping concentrations in the epitaxial layer 220 are within the scope of the present disclosure. Additionally, or alternatively, a content of germanium in the epitaxial layer 220 may be included in a range of approximately 35% to approximately 55%. However, other combinations of materials, dopants, doping concentrations, and compositions (e.g., content of germanium, among other examples) in the epitaxial layer 220 are within the scope of the present disclosure.

An epitaxial layer 218 may be shaped such that portions of the buffer layer 216 are included between the epitaxial layer 218 and one or more adjacent nanostructure channels. Moreover, an epitaxial layer 218 may be shaped such that an epitaxial layer 220 is included in a recess in the epitaxial layer 218. In some implementations, an epitaxial layer 218 is shaped such that ends of the epitaxial layer 218 extend outward past ends of the buffer layer 216 along the Y-direction in the semiconductor device 200. The epitaxial layer 218 may include curved ends that at least partially curve around ends of the buffer layer 216. In some implementations, an epitaxial layer 220 is shaped such that ends of the epitaxial layer 220 extend outward past ends of the epitaxial layer 218 along the Y-direction in the semiconductor device 200.

At least a subset of the nanostructure channels of one or more NMOS active regions 208a extend through one or more gate structures 222. Similarly, at least a subset of the nanostructure channels of one or more PMOS active regions 208b extend through one or more gate structures 222. In some implementations, at least a subset of the nanostructure channels of the isolation region 210 extend through one or more gate structures 222. However, the one or more gate structures 222 through which the nanostructure channels of the isolation region 210 extend may be non-active gate structures.

As further shown in FIG. 2, portions of a gate structure 222 are formed in between pairs of nanostructure channels of an active region in an alternating vertical arrangement in the Z-direction in the semiconductor device 200. In other words, the semiconductor device 200 includes one or more vertical stacks of alternating nanostructure channels and portions of a gate structure 222, as shown in FIG. 2. In this way, a gate structure 222 wraps around an associated nanostructure channel of an active region on all sides of the nanostructure channel of the active region, which increases control of the nanostructure channel of the active region, increases drive current for the nanostructure transistor(s) of the semiconductor device 200, and reduces short channel effects (SCEs) for the nanostructure transistor(s) of the semiconductor device 200. Another portion of a gate structure 222 may be included over and/or on a vertical stack of alternating nanostructure channels and portions of the gate structure 222.

As an example, portions of a gate structure 222 may be included in between and may wrap around nanostructure channels of an NMOS active region 208a between two or more NMOS source/drain regions 212a. Another portion of the gate structure 222 may be included over the NMOS active region 208a and may wrap around two or more sides of the NMOS active region 208a. As another example, portions of a gate structure 222 may be included in between and may wrap around nanostructure channels of a PMOS active region 208b between two or more PMOS source/drain regions 212b. Another portion of the gate structure 222 may be included over the PMOS active region 208b and may wrap around two or more sides of the PMOS active region 208b. As another example, portions of a gate structure 222 may be included in between and may wrap around nanosheet layers or channel layers of the isolation region 210 between an NMOS source/drain region 212a and a PMOS source/drain region 212b. Another portion of the gate structure 222 may be included over the isolation region 210 and may wrap around two or more sides of the isolation region 210. Inner spacers (InSP) 224 may be included between an NMOS source/drain region 212a and an adjacent gate structure 222, and/or between a PMOS source/drain region 212b and an adjacent gate structure 222. Inner spacers 224 may be included on ends of portions of a gate structure 222 between the gate structure 222 and an epitaxial layer 218 of an adjacent source/drain region. The inner spacers 224 may be included in cavities that are formed in between end portions of vertically adjacent nanostructure channels. The inner spacers 224 may be included to reduce parasitic capacitance and to protect the source/drain regions of the semiconductor device 200 from being etched in a nanosheet release operation to remove sacrificial nanosheets between the nanostructure channels of the active regions of the semiconductor device 200. The inner spacers 224 include a silicon nitride ($Si_xN_y$), a silicon oxide ($SiO_x$), a silicon oxynitride (SiON), a silicon oxycarbide (SiOC), a silicon carbon nitride (SiCN), a silicon oxycarbonnitride (SiOCN), and/or another dielectric material.

The gate structures 222 may be formed of one or more layers and/or one or more materials. A gate structure 222 may include one or more metal materials, one or more high dielectric constant (high-k) materials, and/or one or more other types of materials. For example, a gate structure 222 may include a work function tuning layer 226, an interfacial layer 228, a metal electrode layer 230, and/or a gate dielectric layer 232, among other examples. In some implementations, dummy gate structures (e.g., polysilicon (PO) gate structures or another type of gate structures) are formed in the place of (e.g., prior to formation of) the gate structures 222 so that one or more other layers and/or structures of the semiconductor device 200 may be formed prior to formation of the gate structures 222. This reduces and/or prevents damage to the gate structures 222 that would otherwise be caused by the formation of the one or more layers and/or structures. A replacement gate process (RGP) is then performed to remove the dummy gate structures and replace the dummy gate structures with the gate structures 222 (e.g., replacement gate structures).

One or more spacer layers 234 may be included over and/or on sidewalls of the gate structures 222. The one or more spacer layers 234 may include one or more low dielectric constant (low-k) materials having a dielectric constant that is less than the dielectric constant of silicon oxide (e.g., less than approximately 3.9), a silicon oxide ($SiO_x$), a silicon oxynitride (SiON), a silicon nitride ($Si_xN_y$), silicon oxycarbonitride (SiOCN), and/or another suitable dielectric material.

The one or more spacer layer 234 may include a spacer layer 234a that is included on the sidewalls of the gate structures 222, and another spacer layer 234b that is included on the spacer layer 234a. The ends of the spacer layers 234a may wrap around the ends of the spacer layers 234b, as shown in FIG. 2. Moreover, the ends of the spacer layers 234a may be adjacent to or next to sides of the active regions of the semiconductor device 200 (e.g., next to sides of the NMOS active regions 208a, next to sides of the PMOS active regions 208b) and/or may be adjacent to or next to sides of the isolation region 210. The ends of the spacer layers 234a may also be located next to ends of the buffer layers 216 and/or next to ends of the epitaxial layers 218 of one or more source/drain regions of the semiconductor device 200 (e.g., one or more NMOS source/drain regions 212a, one or more PMOS source/drain regions 212b).

The semiconductor device 200 may also include an interlayer dielectric (ILD) layer 236 above the STI regions 206. The ILD layer 236 may be referred to as an ILD0 layer. The ILD layer 236 may be included between the gate structures 222 of the semiconductor device 200 to provide electrical isolation and/or insulation between the gate structures 222 and/or the source/drain regions of the semiconductor device 200, among other examples. The ILD layer 236 may include a silicon nitride ($SiN_x$), an oxide (e.g., a silicon oxide ($SiO_x$) and/or another oxide material), and/or another type of dielectric material. The ILD layer 236 may be surrounded by a contact etch stop layer (CESL) 238, which may include aluminum oxide ($Al_2O_3$), aluminum nitride (AlN), silicon nitride (SiN), silicon oxynitride ($SiO_xN_y$), aluminum oxynitride (AlON), and/or a silicon oxide ($SiO_x$), among other examples.

As shown in FIG. 2, a portion of the ILD layer 236 may extend below the bottom of the gate structures 222. The portion of the ILD layer 236 that is below the bottom of the gate structures 222 may be included in an oxide region 240 that is included within an STI region 206. The oxide region 240 may include a silicon oxide ($SiO_x$) and/or another oxide material.

As shown in FIG. 2, and as described in greater detail herein (e.g., in connection with FIGS. 3A, 3B, 4A, and 4B, among other examples), one or more sides of the NMOS source/drain regions 212a and one or more sides of the PMOS source/drain regions 212b are staggered or are offset in the Y-direction of the semiconductor device 200 in a top-down view of the semiconductor device 200. In other words, while sides (or edges) of the NMOS source/drain regions 212a and sides (or edges) of the PMOS source/drain regions 212b may be approximately parallel, the sides (or edges) of the NMOS source/drain regions 212a and sides (or edges) of the PMOS source/drain regions 212b are not aligned (e.g., not in the same plane) along the X-direction in a top-down view of the semiconductor device 200. This results in the nanosheet layers of the isolation region 210 being curved between the NMOS source/drain region 212a and the PMOS source/drain region 212b that are next to opposing sides of the isolation region 210. The curved shaped of the isolation region 210 increases the distance between the NMOS source/drain region 212a and the PMOS source/drain region 212b that are next to opposing sides of the isolation region 210 than if the isolation region 210 were rectangular shaped (and if sides of the isolation region 210 were straight lines between the NMOS source/drain region 212a and the PMOS source/drain region 212b). The increased distance between the NMOS source/drain region 212a and the PMOS source/drain region 212b, provided by the curved shape of the isolation region 210, provides increased isolation between the NMOS source/drain region 212a and the PMOS source/drain region 212b, and reduces the likelihood of merging of the NMOS source/drain region 212a and the PMOS source/drain region 212b during fabrication of the semiconductor device 200.

As indicated above, FIG. 2 is provided as an example. Other examples may differ from what is described with regard to FIG. 2.

Figure 3A:
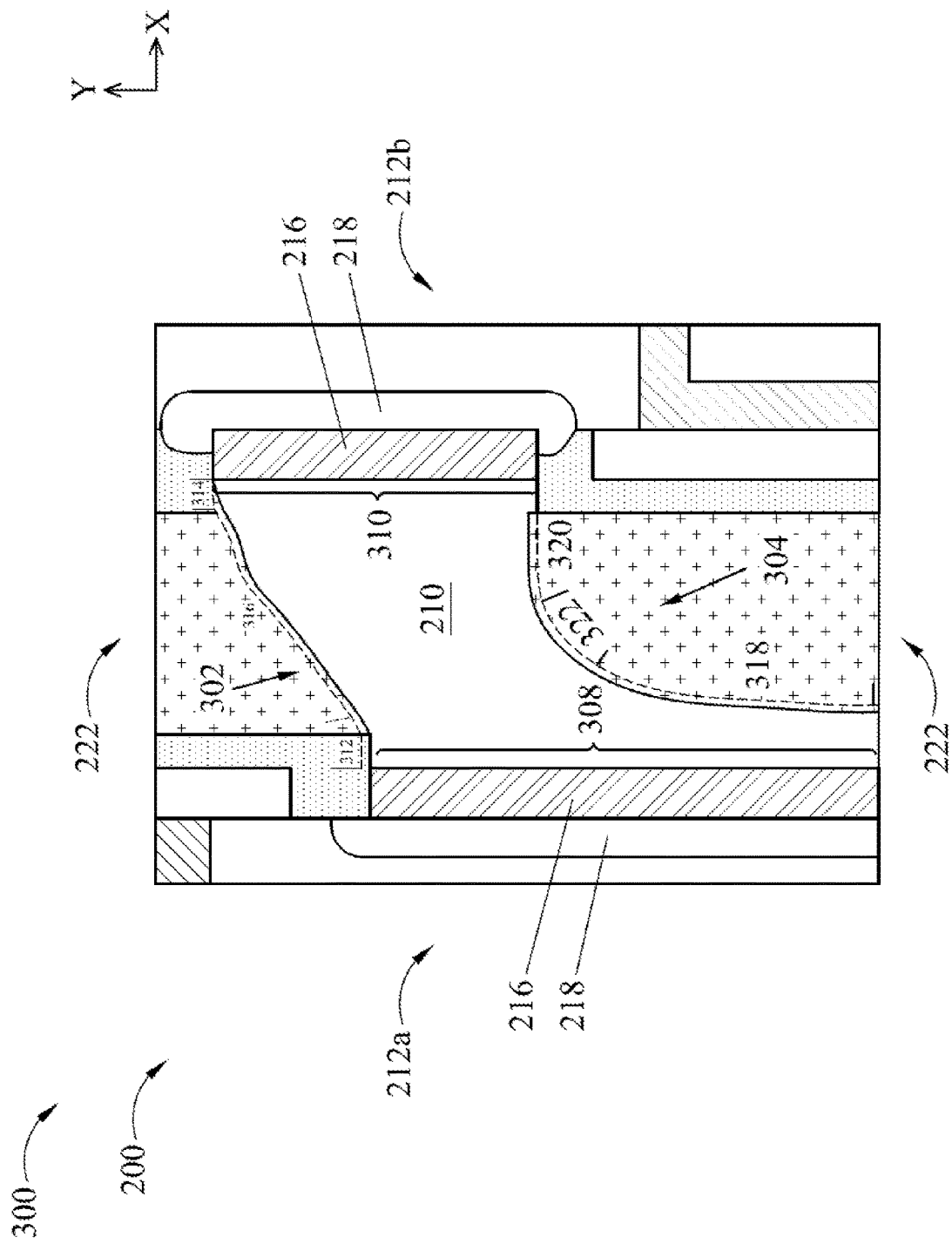
FIGS. 3A and 3B are diagrams of an example implementation of a portion of a semiconductor device described herein.
Figure 3B:
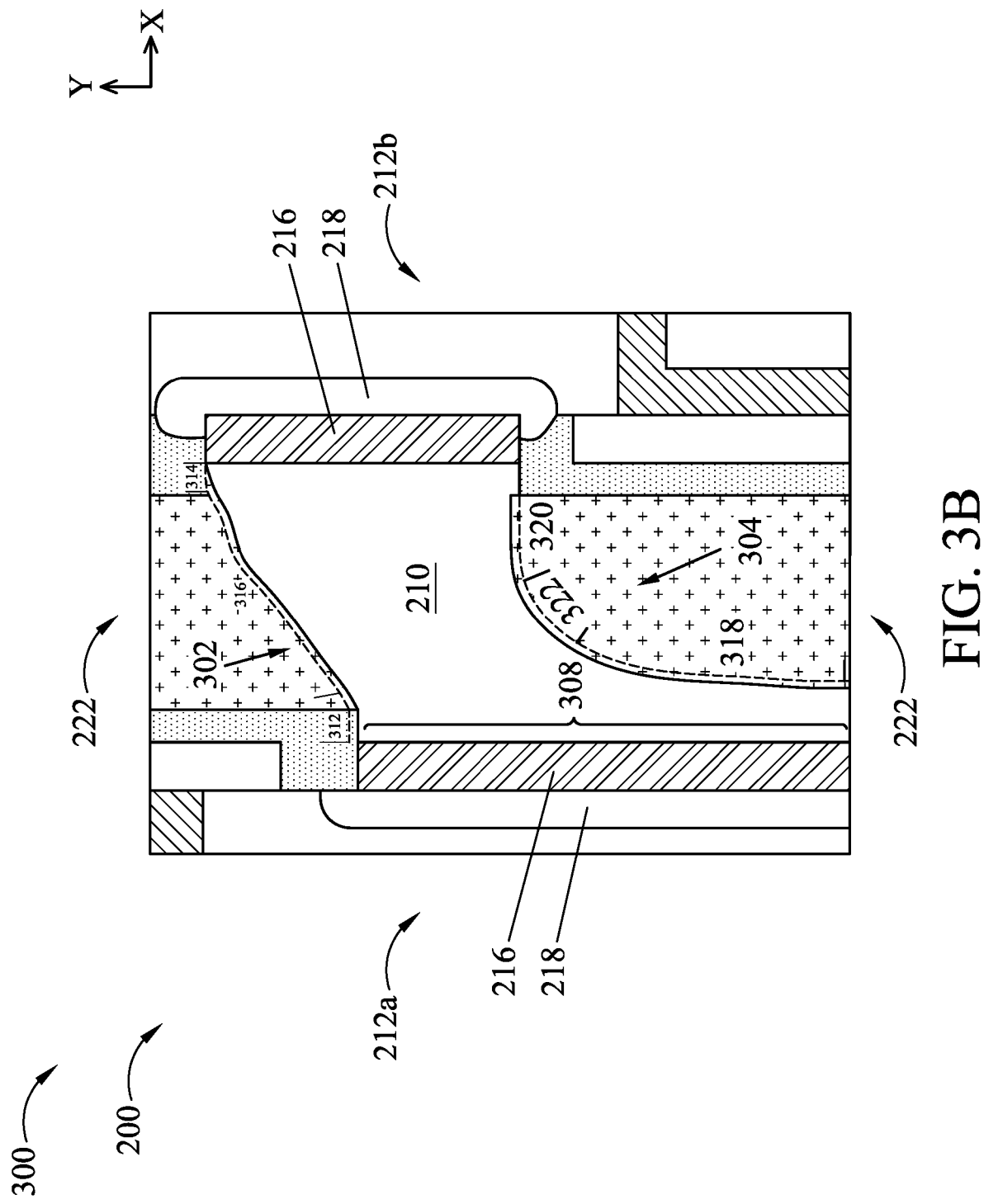

FIGS. 3A and 3B are diagrams of an example implementation 300 of a portion of the semiconductor device 200 described herein. In particular, FIGS. 3A and 3B are top-down views of the portion of the semiconductor device 200, and illustrate features, structures, and/or layers that are viewable in a top-down view of the semiconductor device 200.

As shown in FIG. 3A, the isolation region 210 may include a first edge 302 and a second edge 304. The first edge 302 may extend between a buffer layer 216, of an NMOS source/drain region 212a adjacent to or next to a first side the isolation region 210, and a buffer layer 216 of a PMOS source/drain region 212b adjacent to a second side of the isolation region 210 opposing the first side. The second edge 304 may extend between the buffer layer 216 of the NMOS source/drain region 212a and the buffer layer 216 of the PMOS source/drain region 212b.

The first edge 302 and the second edge 304 are on opposing sides of the isolation region 210 and are adjacent to a gate structure 222. It is to be noted that the gate structure 222 adjacent to the first edge 302 and the second edge 304 may also wrap around the top of the isolation region 210. However, the portion of the gate structure 222 that wraps around the top of the isolation region 210 is omitted in FIG. 3A for clarity.

As further shown in FIG. 3A, the first edge 302 and the second edge 304 are curved in the top-down view of the semiconductor device 200. The first edge 302 and the second edge 304 may be curved between the buffer layer 216 of the NMOS source/drain region 212a and the buffer layer 216 of the PMOS source/drain region 212b. The curvature of the first edge 302 and of the second edge 304 may result from the offset of the one or more sides of the NMOS source/drain regions 212a and one or more sides of the PMOS source/drain regions 212b in the Y-direction of the semiconductor device 200. Additionally and/or alternatively, the curvature of the first edge 302 and of the second edge 304 may result from a length dimension of the NMOS source/drain regions 212a being greater in the Y-direction relative to a length dimension of the PMOS source/drain regions 212b in the Y-direction.

As further shown in FIG. 3A, one or more of the NMOS active regions 208a or the PMOS active regions 208b may include recesses 306 on opposing sides in the Y-direction. The recesses 306 may occur as a result of one or more processing operations that are performed in the fabrication of the semiconductor device 200. For example, isolation liners may be formed on sidewalls of the nanosheet layers of the semiconductor device 200, and one or more dummy gate structures, may be formed over the isolation liners. Subsequently, the nanosheet layers may be etched to form the NMOS active regions 208a, the PMOS active regions 208b, and the isolation region 210. In a replacement gate process, the one or more dummy gate structures may be removed along with the isolation liners. Removal of the isolation liners may result in etching into the sidewalls of the NMOS active regions 208a and/or into the sidewalls of the PMOS active regions 208b (and in some cases, into the sidewalls of the isolation region 210), which results in formation of the recesses 306. The recesses 306 may prevent or reduce the likelihood of extrusion of the gate structures 222 into the adjacent source/drain regions (e.g., adjacent NMOS source/drain regions 212a, adjacent PMOS source/drain regions 212b), which would otherwise result in electrical shorting between the gate structures 222 and the adjacent source/drain regions.

FIG. 3B illustrates a close-up top-down view of the isolation region 210. As shown in FIG. 3B, the isolation region 210 may include a connection region 308 and a connection region 310. The connection regions 308 and 310 may be located on opposing sides of the isolation region 210. The connection region 308 includes a portion of the isolation region 210 that is in contact with an adjacent NMOS source/drain region 212a. The connection region 308 of the isolation region may span approximately the entire length of the buffer layer 216 of the NMOS source/drain region 212a in the Y-direction. This prevents or reduces the likelihood of the epitaxial layer 218 of the NMOS source/drain region 212a extruding into a gate structure 222 associated with the isolation region 210.

The connection region 310 includes a portion of the isolation region 210 that is in contact with an adjacent PMOS source/drain region 212b. The connection region 310 of the isolation region may span approximately the entire length of the buffer layer 216 of the PMOS source/drain region 212b in the Y-direction. This prevents or reduces the likelihood of the epitaxial layer 218 of the PMOS source/drain region 212b extruding into a gate structure 222 associated with the isolation region 210. The widths of the buffer layers 216 of the NMOS source/drain region 212a and the PMOS source/drain region 212b in the X-direction may be less than the widths of the spacer layers 234 to further prevent or reduce the likelihood of the epitaxial layers 218 of the NMOS source/drain region 212a and of the PMOS source/drain region 212b extruding into the gate structure 222 associated with the isolation region 210.

As further shown in FIG. 3B, the first edge 302 may include a plurality of curve segments that have different slopes, different lengths, and/or one or more other different dimensions. The first edge 302 may include a curve segment 312 adjacent to the connection region 308, a curve segment 314 adjacent to the connection region 310, and a curve segment 316 between the curve segments 312 and 314. The curve segment 316 may have a length that is greater relative to a length of the curve segments 312 and 314. The curve segments 312 and 314 may have flatter or shallower slopes relative to the slope of the curve segment 316.

The second edge 304 may include a curve segment 318 adjacent to the connection region 308, a curve segment 320 adjacent to the connection region 310, and a curve segment 322 between the curve segments 318 and 320. The curve segment 318 may have a length that is greater relative to a length of the curve segments 320 and 322. The curve segment 318 may have the greatest slope, followed by the slope of the curve segment 322, followed by the slope of the curve segment 320. The curvature of the second edge 304 results in a portion of the isolation region 210 (and thus, a portion of the nanosheet layers of the isolation region 210) being located between the gate structure 222 and the buffer layer 216 of the NMOS source/drain region 212a.

The overall length of the second edge 304 along the curve segments 318-322 may be greater relative to a length of the first edge 302 along the curve segments 312-316. This may result, for example, due to the relative positions of the NMOS source/drain region 212a and the PMOS source/drain region 212b in the Y-direction, and/or due to the difference in size of the NMOS source/drain region 212a and the PMOS source/drain region 212b in the Y-direction, among other examples.

The overall radius of curvature of the second edge 304 along the curve segments 318-322 may be greater relative to the overall radius of curvature of the first edge 302 along the curve segments 312-316. For example, the radius of curvature of the second edge 304 may be included in a range of approximately 0.8 nanometers to approximately 1.2 nanometers, whereas the radius of curvature of the first edge 302 may be included in a range of approximately 0.5 nanometers to approximately 0.9 nanometers. Forming the isolation region 210 such that the radius of curvature of the second edge 304 is included in a range of approximately 0.8 nanometers to approximately 1.2 nanometers, and such that the radius of curvature of the first edge 302 is included in the range of approximately 0.5 nanometers to approximately 0.9 nanometers, may reduce the likelihood of extrusions between the NMOS source/drain region 212a and the gate structure 222, and between the PMOS source/drain region 212b and the gate structure 222. However, other values for these ranges are within the scope of the present disclosure.

As indicated above, FIGS. 3A and 3B are provided as examples. Other examples may differ from what is described with regard to FIGS. 3A and 3B.

Figure 4A:
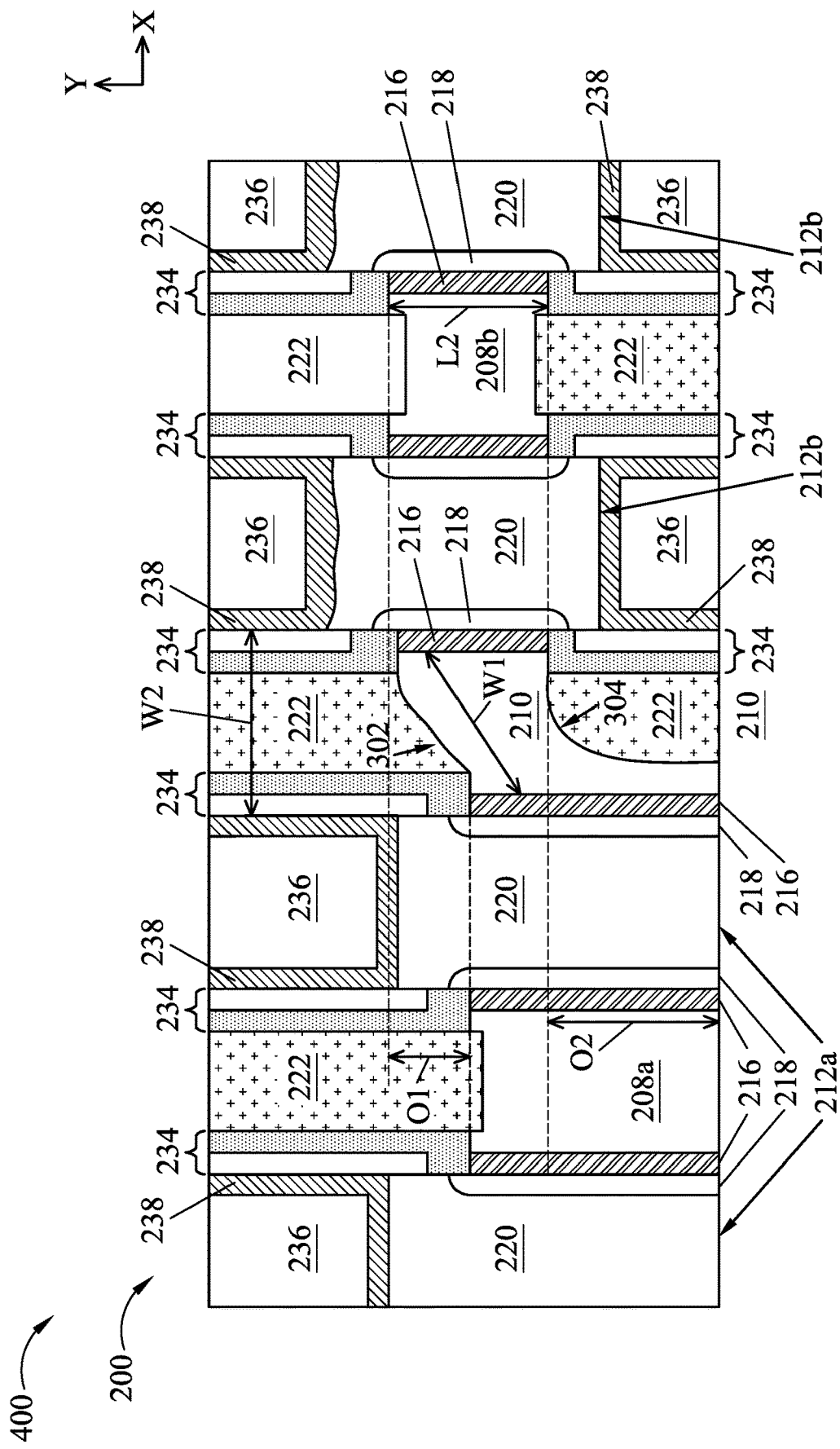
FIGS. 4A-4C are diagrams of example implementations of various dimensions of a semiconductor device described herein.
Figure 4B:
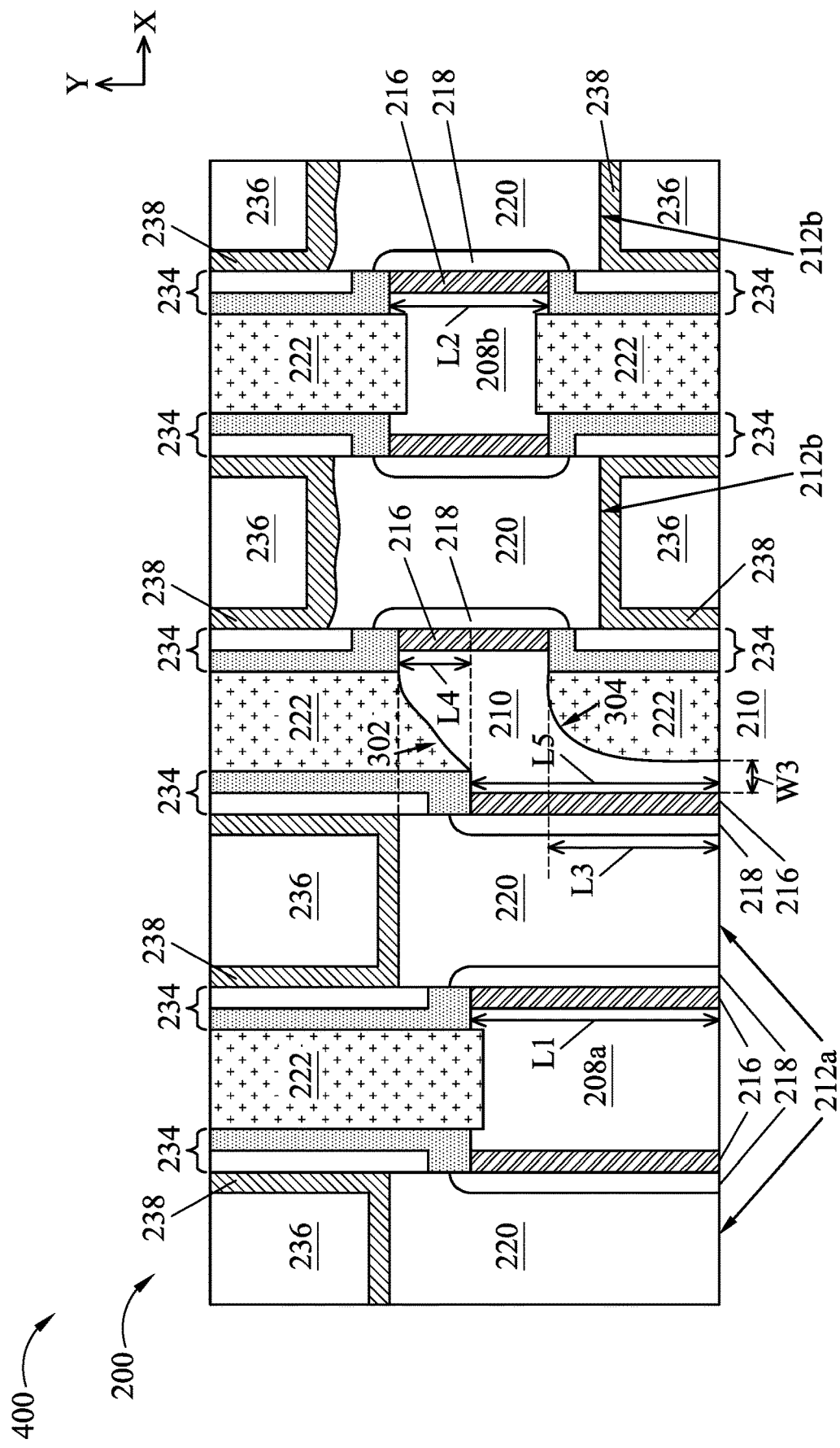
Figure 4C:
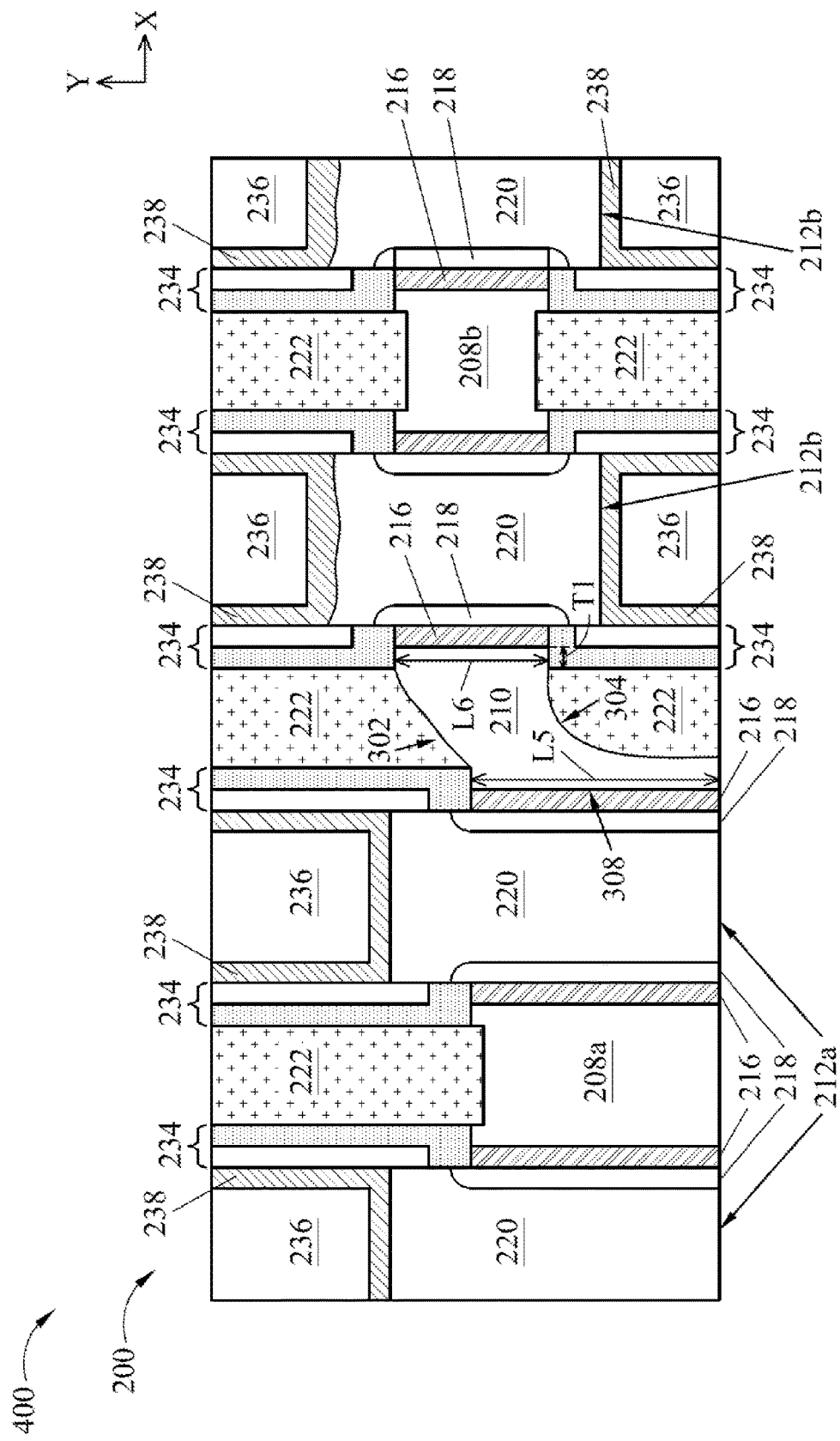

FIGS. 4A-4C are diagrams of example implementations 400 of various dimensions of the semiconductor device 200 described herein. In particular, FIGS. 4A-4C illustrate various top-down view dimensions of the semiconductor device 200.

As shown in FIG. 4A, an example dimension of the semiconductor device 200 may include an offset O1 between a first edge of an NMOS active region 208a and a corresponding first edge of a PMOS active region 208b on opposing sides of the isolation region 210 in the X-direction. The offset O1 may be in the Y-direction. In other words, the respective first edges of the NMOS active region 208a and the PMOS active region 208b are located in different planes in the X-direction. In some implementations, the offset O1 may be included in a range of approximately 15 nanometers to approximately 30 nanometers. However, other values for the range are within the scope of the present disclosure.

As further shown in FIG. 4A, an example dimension of the semiconductor device 200 may include an offset O2 between a second edge of the NMOS active region 208a opposing the first edge of the NMOS active region 208a, and a corresponding second edge of the PMOS active region 208b opposing the first edge of the PMOS active region 208b. The offset O2 may be in the Y-direction. In other words, the respective second edges of the NMOS active region 208a and the PMOS active region 208b are located in different planes in the X-direction. In some implementations, the offset O2 may be included in a range of approximately 15 nanometers to approximately 150 nanometers. However, other values for the range are within the scope of the present disclosure.

As further shown in FIG. 4A, an example dimension of the semiconductor device 200 may include a width W1 of the isolation region 210 between an NMOS source/drain region 212a and a PMOS source/drain region 212b on opposing sides of the isolation region 210, and between the connection regions 308 and 310. The offset O1 and the offset O2 result in the width W1 being diagonal across the isolation region 210 between the connection regions 308 and 310, as opposed to being fully in the X-direction, which increases the magnitude of the width W1 than if the width W1 were fully in the X-direction. For example, the offset O1 and the offset O2 may result in a width W1 (e.g., a diagonal width) that is included in a range of approximately 18 nanometers to approximately 60 nanometers, whereas a width W2 between contact etch stop layers 238 adjacent to opposing sides of the isolation region 210 may be included in a range of approximately 10 nanometers to approximately 50 nanometers. The width W1 being included in the range of approximately 18 nanometers to approximately 60 nanometers may enable the isolation region 210 to provide increased electrical isolation between the NMOS source/drain region 212a and the PMOS source/drain region 212b, and may reduce the likelihood of merging between the NMOS source/drain region 212a and the PMOS source/drain region 212b than if the width W1 were fully in the X-direction. The offset O1 and the offset O2 may be included in the respective offset ranges described above to achieve a width W1 included in this range. However, other values for the range of the width W1 are within the scope of the present disclosure.

As shown in FIG. 4B, an example dimension of the semiconductor device 200 may include a width W3 of a portion of the isolation region 210 between the gate structure 222 associated with the isolation region 210 and the buffer layer 216 of the NMOS source/drain regions 212a adjacent to the isolation region 210. In some implementations, the width W3 is included in a range of approximately 5 nanometers to approximately 20 nanometers to reduce the likelihood of extrusion of the NMOS source/drain region 212a into the gate structure 222 and to provide sufficient area in the nanosheet layers of the isolation region 210 for formation of inner spacers 224 in the isolation region 210. However, other values for the range are within the scope of the present disclosure.

As further shown in FIG. 4B, an example dimension of the semiconductor device 200 may include a length L1 of one or more of the NMOS active regions 208a in the Y-direction of the semiconductor device 200. In some implementations, the length L1 is included in a range of approximately 30 nanometers to approximately 150 nanometers to achieve sufficient epitaxial growth for the NMOS source/drain regions 212a and to reduce the likelihood of extrusion of the NMOS source/drain regions 212a. However, other values for the range are within the scope of the present disclosure.

As further shown in FIG. 4B, an example dimension of the semiconductor device 200 may include a length L2 of one or more of the PMOS active regions 208b in the Y-direction of the semiconductor device 200. The length L1 of the one or more NMOS active regions 208a may be greater relative to the length L2 of the one or more PMOS active regions 208b which, alone or in combination with the offsets O1 and O2, may enable the isolation region 210 to be formed to have the asymmetric and curved shape illustrated in FIG. 4B. However, in other implementations, the length L1 and the length L2 are approximately the same length. In some implementations, the length L2 is included in a range of approximately 25 nanometers to approximately 60 nanometers to achieve sufficient epitaxial growth for the PMOS source/drain regions 212b and to reduce the likelihood of extrusion of the PMOS source/drain regions 212b. However, other values for the range are within the scope of the present disclosure.

As further shown in FIG. 4B, an example dimension of the semiconductor device 200 may include a length L3 of the nanosheet layers of the isolation region 210 between a bottom of the curve the second edge 304 of the isolation region 210 and a top of the curve of the second edge 304. In some implementations, the length L3 is included in a range of approximately 15 nanometers to approximately 150 nanometers to reduce the likelihood of extrusion of the NMOS source/drain region 212a adjacent to the isolation region 210 into the gate structure 222 associated with the isolation region 210. However, other values for the range are within the scope of the present disclosure.

As further shown in FIG. 4B, an example dimension of the semiconductor device 200 may include a length L4 between a bottom of the curve the first edge 302 of the isolation region 210 and a top of the curve of the first edge 302. The length L4 may correspond to a length of a portion of the isolation region 210 (a portion that includes the first edge 302) that extends outward past the buffer layer 216 of the NMOS source/drain region 212a in the Y-direction. In some implementations, the length L4 is included in a range of approximately 15 nanometers to approximately 30 nanometers to reduce the likelihood of extrusion of the PMOS source/drain region 212b adjacent to the isolation region 210 into the gate structure 222 associated with the isolation region 210. However, other values for the range are within the scope of the present disclosure.

As shown in FIG. 4C, an example dimension of the semiconductor device 200 may include a length L5 of the connection region 308 of the isolation region 210 adjacent to or next to the buffer layer 216 of the NMOS source/drain region 212a adjacent to the isolation region 210. In some implementations, the length L3 may be lesser relative the length L5. The length L5 may be greater relative to the length L3 to provide sufficient area in the connection region for the connection between the isolation region 210 and the NMOS source/drain region 212a. In some implementations, the length L5 and the length L1 approximately the same length. In some implementations, the length of the buffer layer 216 of the NMOS source/drain region 212a is lesser than or approximately equal to a length L5 of the isolation region 210 in the connection region 308 to reduce the likelihood of extrusion of the NMOS source/drain region 212a into the gate structure 222, which may reduce the likelihood of merging between the NMOS source/drain region 212a and the PMOS source/drain region 212b along the first edge 302 and/or along the second edge 304. In some implementations, the length L5 is included in a range of approximately 30 nanometers to approximately 150 nanometers to provide sufficient area in the connection region for the connection between the isolation region 210 and the NMOS source/drain region 212a. However, other values for the range are within the scope of the present disclosure.

As further shown in FIG. 4C, an example dimension of the semiconductor device 200 may include a length L6 of the connection region 310 of the isolation region 210 adjacent to or next to the buffer layer 216 of the PMOS source/drain region 212b adjacent to the isolation region 210. In some implementations, the length L4 may be lesser relative the length L6. The length L6 may be greater relative to the length L4 to provide sufficient area in the connection region for the connection between the isolation region 210 and the PMOS source/drain region 212b. In some implementations, the length L6 and the length L2 may be approximately equal lengths. In some implementations, the length of the buffer layer 216 of the PMOS source/drain region 212b is lesser than or approximately equal to a length of the isolation region 210 in the connection region 310 to reduce the likelihood of extrusion of the PMOS source/drain region 212b into the gate structure 222, which may reduce the likelihood of merging between the NMOS source/drain region 212a and the PMOS source/drain region 212b along the first edge 302 and/or along the second edge 304. In some implementations, the length L6 is included in a range of approximately 15 nanometers to approximately 30 nanometers to provide sufficient area in the connection region for the connection between the isolation region 210 and the PMOS source/drain region 212b and to reduce the likelihood of extrusion of the PMOS source/drain region 212b into the gate structure 222 associated with the isolation region 210. However, other values for the range are within the scope of the present disclosure.

As further shown in FIG. 4C, an example dimension of the semiconductor device 200 includes a thickness T1 of the connection region 310. The thickness T1 may be included in a range of approximately 5 nanometers to approximately 20 nanometers to reduce the likelihood of extrusion of the PMOS source/drain region 212b into the gate structure 222 and to achieve sufficient growth of inner spacers 224 in the connection region 310 of the isolation region 210. However, other values for the range are within the scope of the present disclosure.

As indicated above, FIGS. 4A-4C are provided as examples. Other examples may differ from what is described with regard to FIGS. 4A-4C.

Figure 5A:
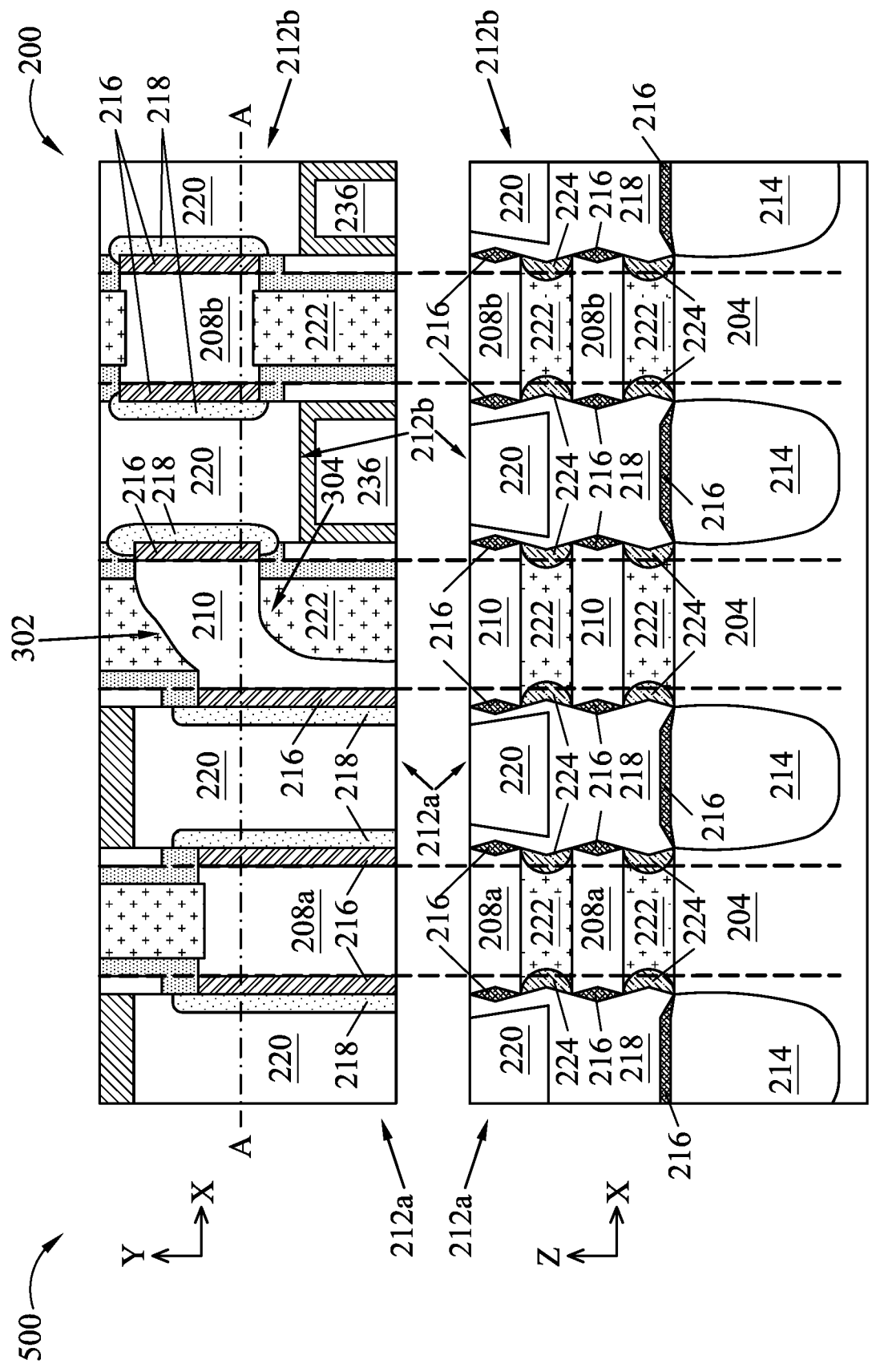
FIGS. 5A and 5B are diagrams of example implementations of portions of a semiconductor device described herein.
Figure 5B:
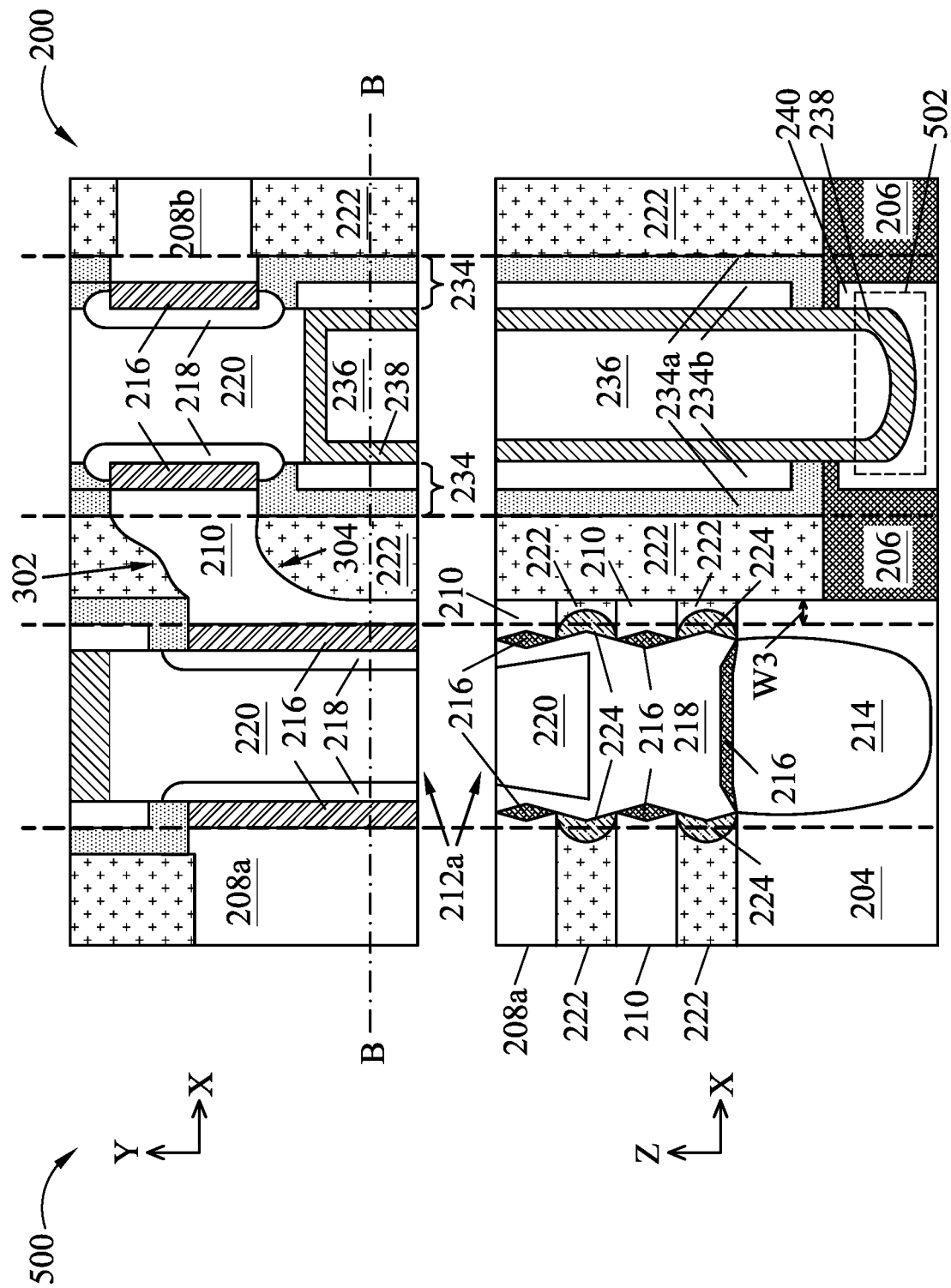

FIGS. 5A and 5B are diagrams of example implementations 500 of portions of the semiconductor device 200 described herein. The top portion of FIG. 5A illustrates a top-down view of a portion of the semiconductor device, and the bottom portion of FIG. 5A illustrates a cross-section view of a portion of the semiconductor device 200 along the cross-sectional plane A-A in the top-down view (which corresponds to the cross-sectional plane A-A in FIG. 2). The cross-sectional plane A-A in the top-down view is along the X-direction in the semiconductor device 200, and includes a portion of an NMOS active region 208a, portions of NMOS source/drain region 212a, a portion of the isolation region 210, a portion of a PMOS active region 208b, and portions of PMOS source/drain regions 212b.

In the cross-section view along the cross-sectional plane A-A in FIG. 5A, the isolation region 210 is side-by-side with an NMOS source/drain region 212a and a PMOS source/drain region 212b on opposing sides of the isolation region 210 along the X-direction. The NMOS source/drain region 212a is between the isolation region 210 and the NMOS active region 208a in the cross-section view along the cross-sectional plane A-A in FIG. 5A. The PMOS source/drain region 212b is between the isolation region 210 and the PMOS active region 208b in the cross-section view along the cross-sectional plane A-A in FIG. 5A.

As shown in the cross-sectional view in FIG. 5A, the nanosheet layers of the NMOS active region 208a alternate with nanosheet layers of an associated gate structure 222. The gate structure 222 fully wraps around the nanosheet layers of the NMOS active region 208a. The nanosheet layers of the NMOS active region 208a and nanosheet layers of the gate structure 222 associated with the NMOS active region 208a may be included between NMOS source/drain regions 212a. The NMOS source/drain regions 212a may be included over epitaxial regions 214 and may each include a buffer layer 216, an epitaxial layer 218, and an epitaxial layer 220. Inner spacers 224 may be included in cavities on ends of the nanosheet layers of the gate structure 222 and between the gate structure 222 and the epitaxial layer 218 of the NMOS source/drain regions 212a. The buffer layers 216 of the NMOS source/drain regions 212a are contained between the inner spacers 224 and between the nanosheet layers of the NMOS active region 208a and the epitaxial layer 218 such that the buffer layer 216 do not extend over the spacer layers 234 and into the gate structure 222. The buffer layers 216 are included between the epitaxial regions 214 and the epitaxial layers 218 of the NMOS source/drain regions 212a to reduce the likelihood of dopant diffusion into the mesa region 204 below the NMOS active region 208a.

The epitaxial layers 220 may be contained within a recess in the epitaxial layers 218 at approximately a same height as or above the uppermost inner spacer 224 to restrict the region of growth of the epitaxial layers 220 due to the relatively high germanium concentration (e.g., in a range of approximately 25% to approximately 55% germanium) in the epitaxial layers 220. This may reduce the likelihood of defect formation in the epitaxial layers 220.

As further shown in the cross-sectional view in FIG. 5A, the nanosheet layers of the PMOS active region 208b alternate with nanosheet layers of an associated gate structure 222. The gate structure 222 fully wraps around the nanosheet layers of the PMOS active region 208b. The nanosheet layers of the PMOS active region 208b and nanosheet layers of the gate structure 222 associated with the PMOS active region 208b may be included between PMOS source/drain regions 212b. The PMOS source/drain regions 212b may be included over epitaxial regions 214 and may each include a buffer layer 216, an epitaxial layer 218, and an epitaxial layer 220. Inner spacers 224 may be included in cavities on ends of the nanosheet layers of the gate structure 222 and between the gate structure 222 and the epitaxial layer 218 of the PMOS source/drain regions 212b. The buffer layers 216 of the PMOS source/drain regions 212b are contained between the inner spacers 224 and between the nanosheet layers of the PMOS active region 208b and the epitaxial layer 218 such that the buffer layer 216 do not extend over the spacer layers 234 and into the gate structure 222. The buffer layers 216 are included between the epitaxial regions 214 and the epitaxial layers 218 of the PMOS source/drain regions 212b to reduce the likelihood of dopant diffusion into the mesa region 204 below the PMOS active region 208b.

The epitaxial layers 220 may be contained within a recess in the epitaxial layers 218 at approximately a same height as or above the uppermost inner spacer 224 to restrict the region of growth of the epitaxial layers 220 due to the relatively high germanium concentration (e.g., in a range of approximately 25% to approximately 55% germanium) in the epitaxial layers 220. This may reduce the likelihood of defect formation in the epitaxial layers 220.

As further shown in the cross-sectional view in FIG. 5A, the nanosheet layers of the isolation region 210 alternate with nanosheet layers of an associated gate structure 222. The gate structure 222 fully wraps around the nanosheet layers of the isolation region 210. The nanosheet layers of the isolation region 210 and nanosheet layers of the gate structure 222 associated with the isolation region 210 may be included between an NMOS source/drain region 212a and a PMOS source/drain region 212b.

A top portion of FIG. 5B illustrates a top-down view of a portion of the semiconductor device, and a bottom portion of FIG. 5B illustrates a cross-section view of a portion of the semiconductor device 200 along the cross-sectional plane B-B in the top-down view (which corresponds to the cross-sectional plane B-B in FIG. 2). The cross-sectional plane B-B in the top-down view is along the X-direction in the semiconductor device 200, and includes a portion of an NMOS active region 208a, a portion of an NMOS source/drain region 212a, a portion of the isolation region 210, a portion of a gate structure 222 associated with the isolation region 210, a portion of the ILD layer 236, and a portion of a gate structure 222 associated with a PMOS active region 208b.

In the cross-section view along the cross-sectional plane B-B in FIG. 5B, the isolation region 210 is side-by-side with the NMOS source/drain region 212a and the gate structure 222, where the gate structure 222 wraps around the nanosheet layers of the isolation region 210. The NMOS source/drain region 212a is between the isolation region 210 and the NMOS active region 208a in the cross-section view along the cross-sectional plane B-B in FIG. 5B. The gate structure 222 is between the isolation region 210 and the ILD layer 236 in cross-section view along the cross-sectional plane B-B in FIG. 5B. The ILD layer 236 is adjacent to a PMOS source/drain region 212b in the Y-direction.

The isolation region 210 is adjacent to the PMOS source/drain region 212b in the cross-sectional plane A-A in FIG.

5A, and is adjacent to the gate structure 222 in the cross-sectional plane B-B in FIG. 5B, due to the curvature of the nanosheet layers of the isolation region 210. The width of the nanosheet layers of the isolation region 210 in the X-direction in the cross-sectional plane A-A in FIG. 5A is also greater relative to the width W3 of the nanosheet layers of the isolation region 210 in the X-direction in the cross-sectional plane B-B in FIG. 5B due to the curvature of the nanosheet layers of the isolation region 210. As further shown in the cross-section view along the cross-sectional plane B-B in FIG. 5B, the ILD layer 236 may include a curved bottom portion 502 that is located in the oxide region 240 that is located within the STI region 206.

As indicated above, FIGS. 5A and 5B are provided as examples. Other examples may differ from what is described with regard to FIGS. 5A and 5B.

FIGS. 6A-6F are diagrams of an example implementation 600 described herein. The example implementation 600 includes an example of forming an isolation region 210 for the semiconductor device 200, where the isolation region 210 includes an asymmetric and/or curved shape. One or more of the semiconductor processing tools 102-112 may perform one or more operations described in connection with FIGS. 6A-6F.

Figure 6A:
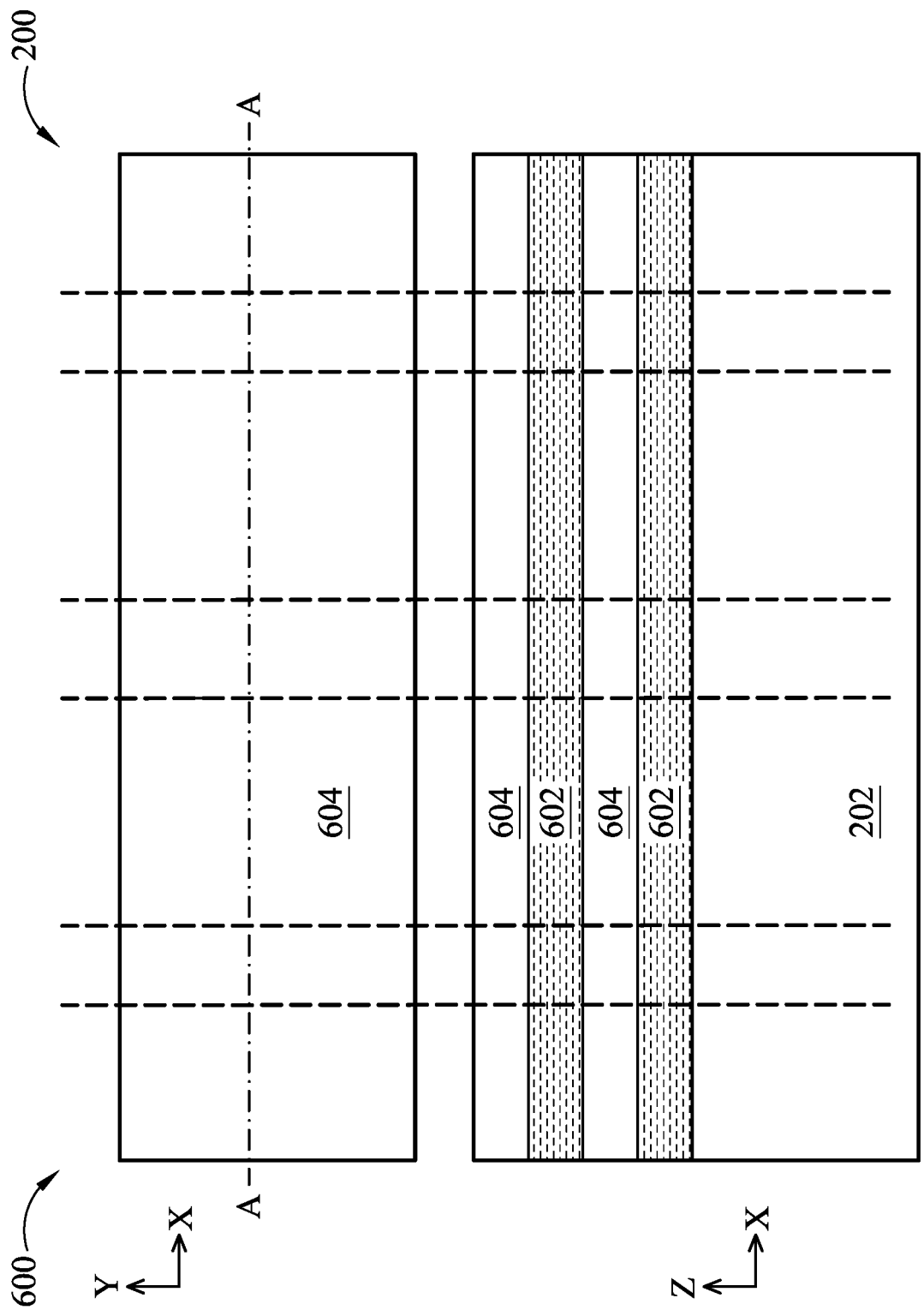
FIGS. 6A-6F are diagrams of an example implementation described herein.

A top portion of FIG. 6A illustrates a top-down view of a portion of the semiconductor device, and a bottom portion of FIG. 6A illustrates a cross-section view of a portion of the semiconductor device 200 along the cross-sectional plane A-A in the top-down view (which corresponds to the cross-sectional plane A-A in FIG. 2). As shown in FIG. 6A, processing of the semiconductor device 200 is performed in connection with the semiconductor substrate 202. The deposition tool 102 may form or deposit a nanosheet stack over and/or on the semiconductor substrate 202. The nanosheet stack may be referred to as a superlattice. In some implementations, one or more operations are performed in connection with the semiconductor substrate 202 prior to formation of the nanosheet stack. For example, an anti-punch through (APT) implant operation may be performed. The APT implant operation may be performed in one or more regions of the semiconductor substrate 202 above which the active regions of the semiconductor device 200 are to be formed. The APT implant operation is performed, for example, to reduce and/or prevent punch-through or unwanted diffusion into the semiconductor substrate 202.

The nanosheet stack includes a plurality of alternating layers that are arranged in a direction (the Z-direction) that is approximately perpendicular to the semiconductor substrate 202. For example, the nanosheet stack includes vertically alternating layers of first layers 602 and second layers 604 above the semiconductor substrate 202. The quantity of the first layers 602 and the quantity of the second layers 604 illustrated in FIG. 6A are examples, and other quantities of the first layers 602 and the second layers 604 are within the scope of the present disclosure. In some implementations, the first layers 602 and the second layers 604 are formed to different thicknesses. For example, the second layers 604 may be formed to a thickness that is greater relative to a thickness of the first layers 602. In some implementations, the first layers 602 (or a subset thereof) are formed to a thickness in a range of approximately 4 nanometers to approximately 7 nanometers. In some implementations, the second layers 604 (or a subset thereof) are formed to a thickness in a range of approximately 8 nanometers to approximately 12 nanometers. However, other values for the thickness of the first layers 602 and for the thickness of the second layers 604 are within the scope of the present disclosure.

The first layers 602 include a first material composition, and the second layers 604 include a second material composition. In some implementations, the first material composition and the second material composition are the same material composition. In some implementations, the first material composition and the second material composition are different material compositions. As an example, the first layers 602 may include silicon germanium (SiGe) and the second layers 604 may include silicon (Si). In some implementations, the first material composition and the second material composition have different oxidation rates and/or etch selectivity.

As described herein, the second layers 604 may be processed to form the nanostructure channels or nanosheet layers of the active regions (e.g., the NMOS active regions 208a, the PMOS active regions 208b) of the nanostructure transistors of the semiconductor device 200. Moreover, the second layers 604 may be processed to form the nanostructure channels or nanosheet layers of the isolation region 210 between two or more nanostructure transistors of the semiconductor device 200. The first layers 602 are sacrificial nanostructures or sacrificial nanosheet layers that are eventually removed and serve to define a vertical distance between adjacent nanostructure channels or nanosheet layers for subsequently-formed gate structures 222 of the semiconductor device 200. Accordingly, the first layers 602 may be referred to as sacrificial layers and the second layers 604 may be referred to as channel layers.

The deposition tool 102 deposits and/or grows the alternating layers of the nanosheet stack to include nanostructures (e.g., nanosheets) on the semiconductor substrate 202. For example, the deposition tool 102 grows the alternating layers by epitaxial growth. However, other processes may be used to form the alternating layers of the nanosheet stack. Epitaxial growth of the alternating layers of the nanosheet stack may be performed by a molecular beam epitaxy (MBE) process, a metalorganic chemical vapor deposition (MOCVD) process, and/or another suitable epitaxial growth process. In some implementations, the epitaxially grown layers such as the second layers 604 include the same material as the material of the semiconductor substrate 202. In some implementations, the first layers 602 and/or the second layers 604 include a material that is different from the material of the semiconductor substrate 202. As described above, in some implementations, the first layers 602 include epitaxially grown silicon germanium (SiGe) layers and the second layers 604 include epitaxially grown silicon (Si) layers. Alternatively, the first layers 602 and/or the second layers 604 may include other materials such as germanium (Ge), a compound semiconductor material such as silicon carbide (SiC), gallium arsenide (GaAs), gallium phosphide (GaP), indium phosphide (InP), indium arsenide (IAs), indium antimonide (InSb), an alloy semiconductor such as silicon germanium (SiGe), gallium arsenide phosphide (GaAsP), aluminum indium arsenide (AlInAs), aluminum gallium arsenide (AlGaAs), indium gallium arsenide (InGaAs), gallium indium phosphide (GaInP), gallium indium arsenide phosphide (GaInAsP), and/or a combination thereof. The material(s) of the first layers 602 and/or the material(s) of the second layers 604 may be chosen based on providing different oxidation properties, different etching selectivity properties, and/or other different properties.

In some implementations, the deposition tool 102 may form one or more additional layers over and/or on the nanosheet stack. For example, a hard mask (HM) layer may be formed over and/or on the nanosheet stack (e.g., on the top-most second layer 604 of the nanosheet stack). As another example, a capping layer be formed over and/or on the hard mask layer. As another example, another hard mask layer including an oxide layer and a nitride layer may be formed over and/or on the capping layer. The one or more hard mask (HM) layers may be used to form one or more structures of the semiconductor device 200. The oxide layer may function as an adhesion layer between the nanosheet stack and the nitride layer, and may act as an etch stop layer for etching the nitride layer. The one or more hard mask layers may include silicon germanium (SiGe), a silicon nitride ($Si_xN_y$), a silicon oxide ($SiO_x$), and/or another material. The capping layer may include silicon (Si) and/or another material. In some implementations, the capping layer is formed of the same material as the semiconductor substrate 202. In some implementations, the one or more additional layers are thermally grown, deposited by CVD, PVD, ALD, and/or are formed using another deposition technique.

Figure 6B:
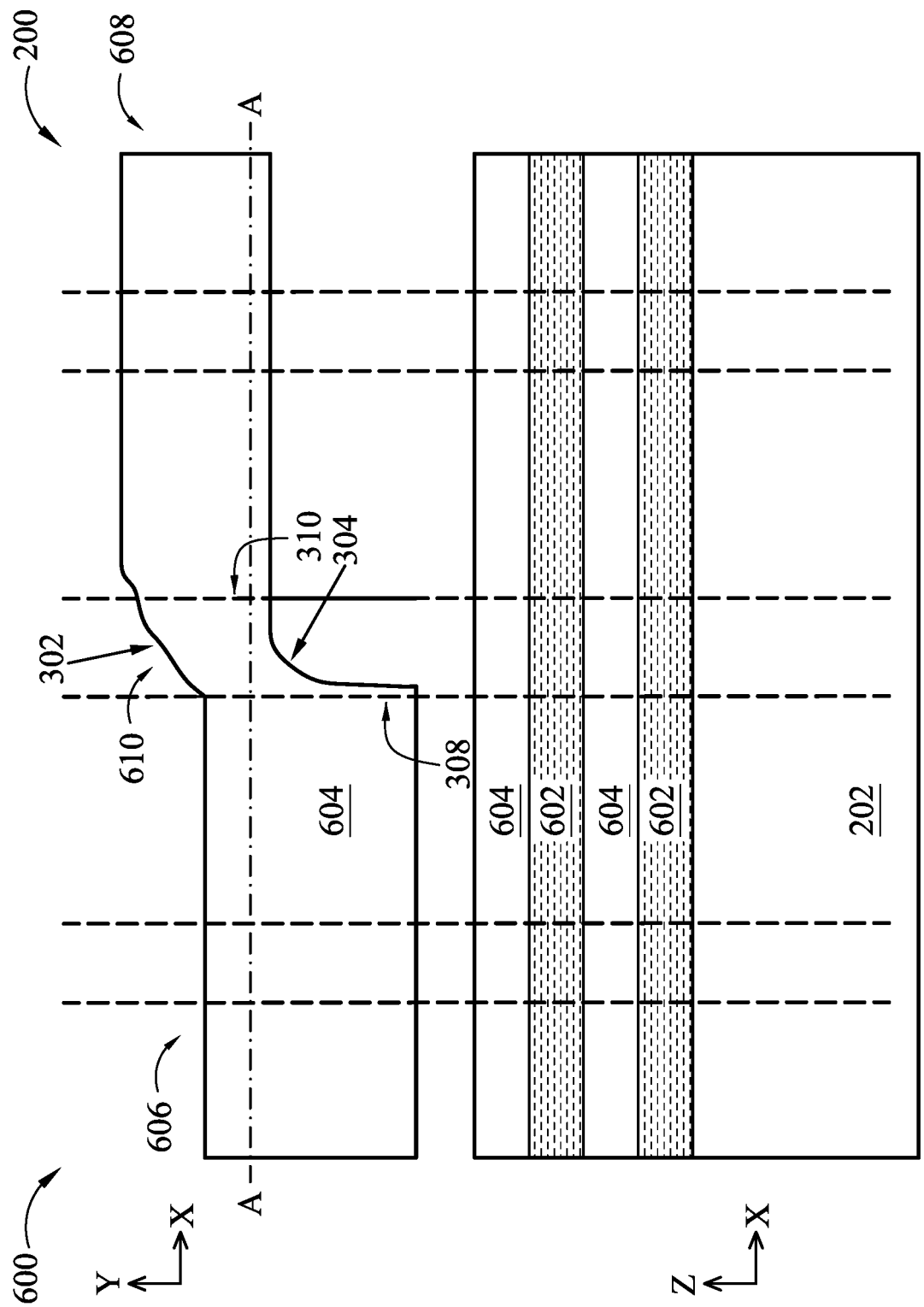

A top portion of FIG. 6B illustrates a top-down view of a portion of the semiconductor device, and a bottom portion of FIG. 6B illustrates a cross-section view of a portion of the semiconductor device 200 along the cross-sectional plane A-A in the top-down view (which corresponds to the cross-sectional plane A-A in FIG. 2). As shown in FIG. 6B, the alternating first layers 602 and second layers 604 of the nanosheet stack, and the semiconductor substrate 202 are etched to remove portions of the alternating first layers 602 and second layers 604 of the nanosheet stack, and to remove portions of the semiconductor substrate 202. The remaining portions of the alternating first layers 602 and second layers 604 of the nanosheet stack after the etch operation include a first semiconductor device region 606, a second semiconductor device region 608, and a transition region 610 that extends between the first semiconductor device region 606 and the second semiconductor device region 608 along the X-direction in the top-down view of the semiconductor device 200.

The first semiconductor device region 606 may include a region in which NMOS nanostructure transistors of the semiconductor device 200 are to be formed. The second semiconductor device region 608 may include a region in which PMOS nanostructure transistors of the semiconductor device 200 are to be formed. The transition region 610 may include a region in which an isolation region 210 of the semiconductor device 200 is to be formed.

The first semiconductor device region 606, the second semiconductor device region 608, and the transition region 610 may be formed by any suitable semiconductor processing technique. For example, the deposition tool 102, the exposure tool 104, the developer tool 106, and/or the etch tool 108 may form the first semiconductor device region 606, the second semiconductor device region 608, and the transition region 610 using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, a sacrificial layer may be formed over a substrate and patterned using a photolithography process. Spacers are formed alongside the patterned sacrificial layer using a self-aligned process. The sacrificial layer is then removed, and the remaining spacers may then be used to pattern the fin structures.

In some implementations, the deposition tool 102 forms a photoresist layer over and/or on hard mask layer including, the exposure tool 104 exposes the photoresist layer to radiation (e.g., deep ultraviolet (UV) radiation, extreme UV (EUV) radiation), a post-exposure bake process is performed (e.g., to remove residual solvents from the photoresist layer), and the developer tool 106 develops the photoresist layer to form a pattern in the photoresist layer, which is then used to pattern the hard mask layer. In some implementations, patterning the photoresist layer to form the pattern is performed using an electron beam (e-beam) lithography process, and etching is used to transfer the pattern to the hard mask layer. The etch tool 108 may then etch into the alternating first layers 602 and second layers 604, and into the semiconductor substrate 202, based on the pattern in the hard mask layer to form the first semiconductor device region 606, the second semiconductor device region 608, and the transition region 610.

As further shown in FIG. 6B, the first semiconductor device region 606 and the second semiconductor device region 608 are staggered in the Y-direction along the X-direction. In other words, edges of the first semiconductor device region 606 and edges the second semiconductor device region 608 are in different planes along the X-direction. The staggering of the first semiconductor device region 606 and the second semiconductor device region 608 results in the asymmetric and/or curved shaped of the transition region 610 shown in FIG. 6B. The transition region 610 includes a first edge 302 and a second edge 304 that are curved between the first semiconductor device region 606 and the second semiconductor device region 608.

Figure 6C:
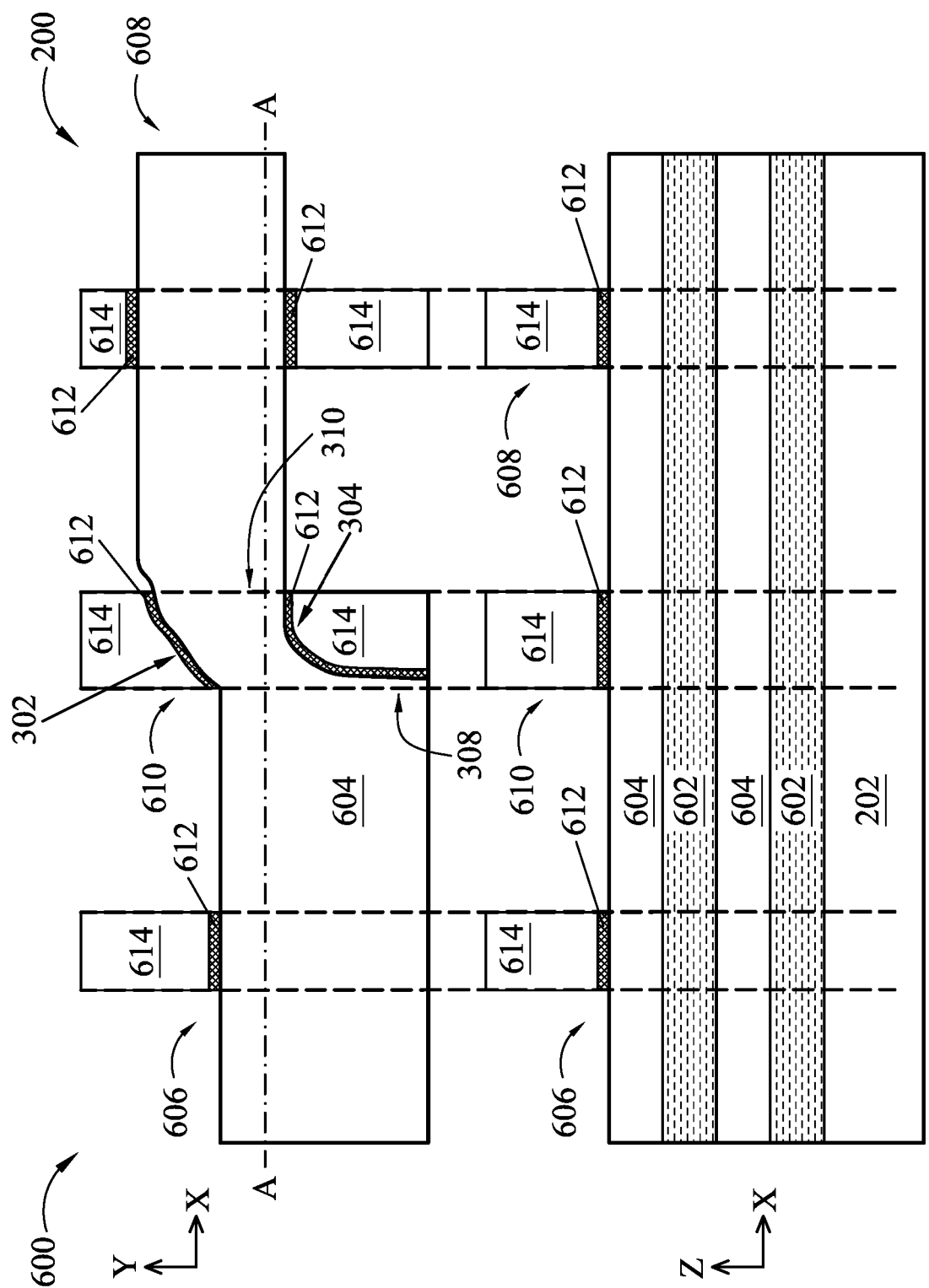

A top portion of FIG. 6C illustrates a top-down view of a portion of the semiconductor device, and a bottom portion of FIG. 6C illustrates a cross-section view of a portion of the semiconductor device 200 along the cross-sectional plane A-A in the top-down view (which corresponds to the cross-sectional plane A-A in FIG. 2). As shown in FIG. 6C, an isolation liner 612 may be formed on sidewalls and on a top surface of the topmost second layer 604. A polysilicon (PO) layer may be formed over and/or on the isolation liner 612. In some implementations, the isolation liner 612 corresponds to a portion of the STI regions 206 that are deposited around the first semiconductor device region 606, the second semiconductor device region 608, and the transition region 610. The deposition tool 102 may deposit the isolation liner 612 and the polysilicon layer using a CVD technique, a PVD technique, an ALD technique, an epitaxy technique, and/or another suitable deposition technique.

The isolation liner 612 may include a dielectric material such as a silicon oxide ($SiO_x$), a silicon nitride ($Si_xN_y$), a silicon oxynitride (SiON), fluoride-doped silicate glass (FSG), a low-k dielectric material, and/or another suitable insulating material. The polysilicon layer may include a polycrystalline silicon and/or another suitable material.

Portions of the polysilicon layer and corresponding portions of the isolation liner 612 may be removed. The remaining portions of the polysilicon layer may correspond to dummy gate structures 614, where the remaining portions of the isolation liner 612 are included between the dummy gate structures 614 and the nanosheet stack of the semiconductor device 200. A dummy gate structure may be included over and may wrap around the sidewalls of the nanosheet stack in the first semiconductor device region 606. A dummy gate structure may be included over and may wrap around the sidewalls of the nanosheet stack in the second semiconductor device region 608. A dummy gate structure may be included over and may wrap around the sidewalls of the nanosheet stack in the transition region 610. Additional dummy gate structures 614 may be included in the semiconductor device 200.

In some implementations, a pattern in a photoresist layer is used to etch the isolation liner 612 and the polysilicon layer to form the dummy gate structures 614. In these implementations, the deposition tool 102 forms the photoresist layer on the polysilicon layer. The exposure tool 104 exposes the photoresist layer to a radiation source to pattern the photoresist layer. The developer tool 106 develops and removes portions of the photoresist layer to expose the pattern. The etch tool 108 etches the polysilicon layer and the isolation liner 612 based on the pattern to form the dummy gate structure 614. In some implementations, the etch operation includes a plasma etch operation, a wet chemical etch operation, and/or another type of etch operation. In some implementations, a photoresist removal tool removes the remaining portions of the photoresist layer (e.g., using a chemical stripper, plasma ashing, and/or another technique). In some implementations, a hard mask layer is used as an alternative technique for etching the polysilicon layer based on a pattern. In some implementations, a photoresist removal tool removes the remaining portions of the photoresist layer (e.g., using a chemical stripper, plasma ashing, and/or another technique).

Figure 6D:
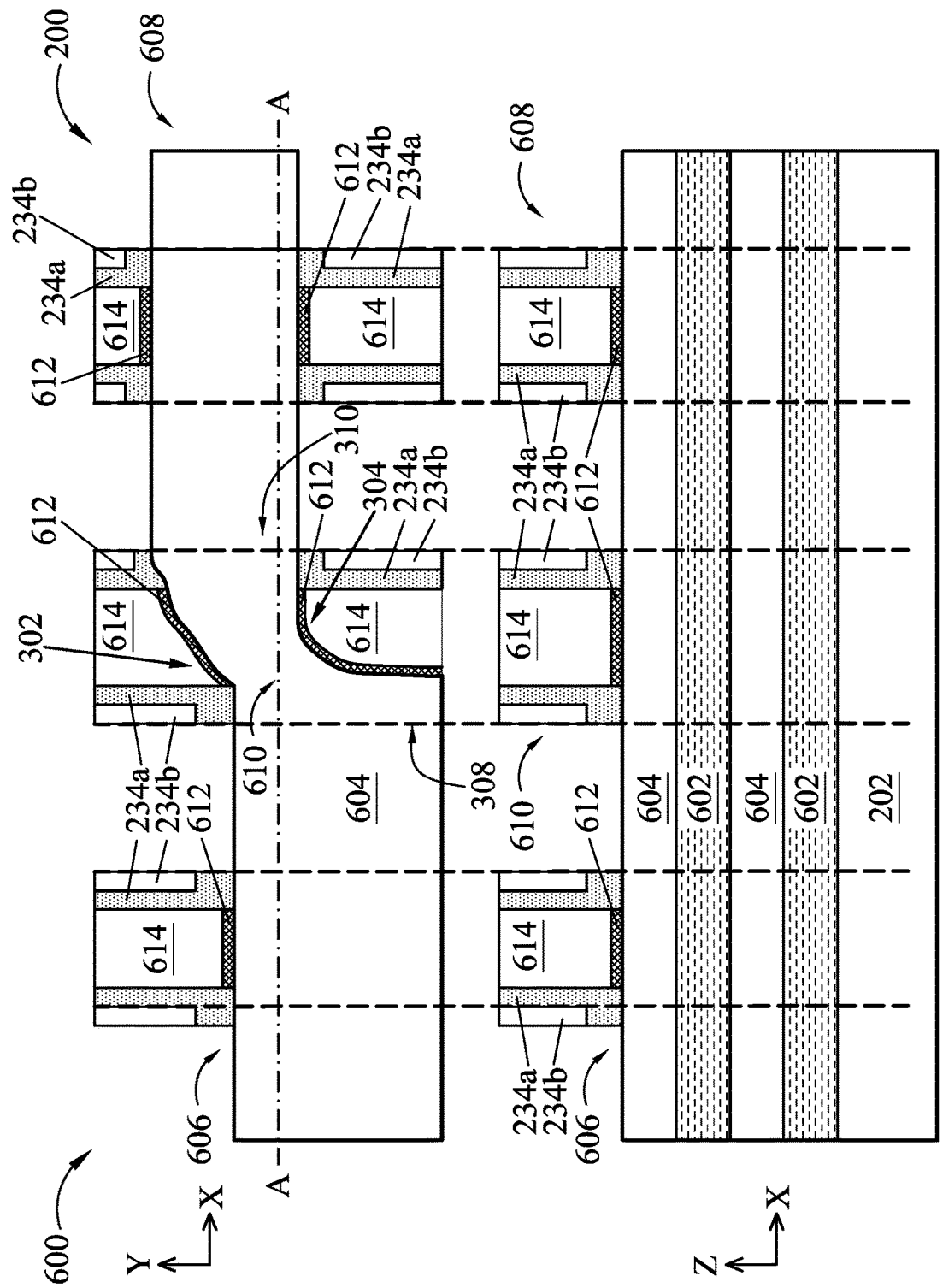

A top portion of FIG. 6D illustrates a top-down view of a portion of the semiconductor device, and a bottom portion of FIG. 6D illustrates a cross-section view of a portion of the semiconductor device 200 along the cross-sectional plane A-A in the top-down view (which corresponds to the cross-sectional plane A-A in FIG. 2). As shown in FIG. 6D, spacer layers 234 may be formed over and/or on the sidewalls of the dummy gate structures 614. The deposition tool 102 may conformally deposit the spacer layers 234, and the etch tool 108 may etch back the conformally deposited material such that the spacer layers 234 remain on the sidewalls of the dummy gate structures 614. In some implementations, the spacer layers 234 include a plurality of types of spacer layers. For example, the spacer layers 234 may include a spacer layer 234a (sometimes referred to as a seal spacer layer) that is formed on the sidewalls of the dummy gate structures 614 and a spacer layer 234b (sometimes referred to as a bulk spacer layer) that is formed on the spacer layer 234a. The spacer layers 234a and 234b may be formed of similar materials or different materials. In some implementations, the spacer layer 234b is formed without plasma surface treatment that is used for the spacer layer 234a.

As further shown in FIG. 6D, the spacer layers 234 are formed on a subset of the sidewalls of the dummy gate structure 614 in the transition region 610. The spacer layers 234 may be included on the sidewall of the dummy gate structure 614 on both sides of the connection region 310. However, the spacer layers 234 are included on the sidewall of the dummy gate structure 614 only on one side of the connection region 308, as shown in the top-down view in FIG. 6D. This occurs due to the curvature of the second edge 304. The curvature of the second edge 304 provides a transition between the semiconductor device region 606 and the semiconductor device region 608, and results in a portion of the nanosheet stack (including a portion of the first layers 602 and a portion of the second layers 604) being between the dummy gate structure 614 and the connection region 308 in the transition region 610.

Figure 6E:
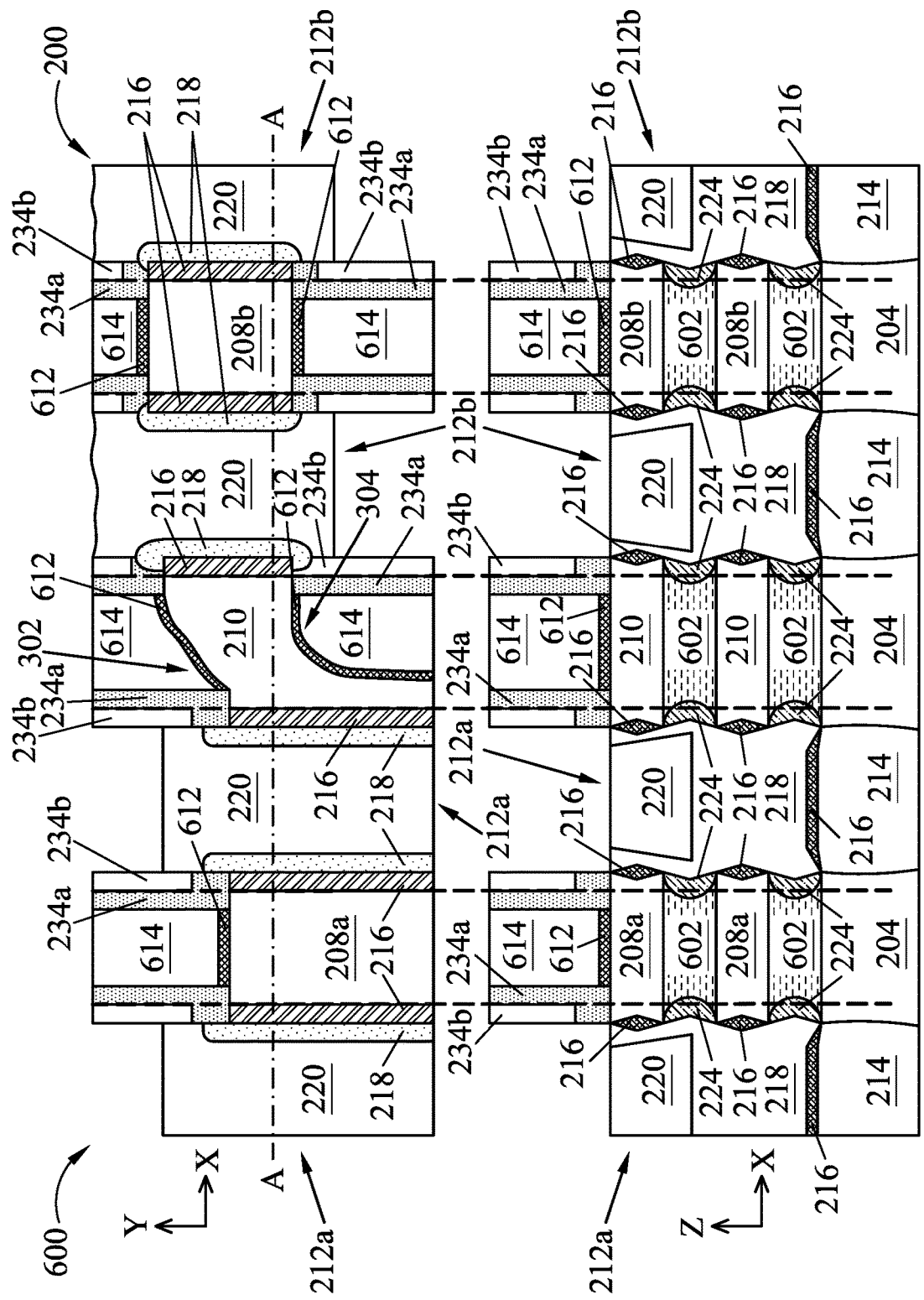

A top portion of FIG. 6E illustrates a top-down view of a portion of the semiconductor device, and a bottom portion of FIG. 6E illustrates a cross-section view of a portion of the semiconductor device 200 along the cross-sectional plane A-A in the top-down view (which corresponds to the cross-sectional plane A-A in FIG. 2). As shown in FIG. 6E, NMOS source/drain regions 212a may be formed in the first semiconductor device region 606, and PMOS source/drain regions 212b may be formed in the second semiconductor device region 608. The formation of the NMOS source/drain regions 212a and the PMOS source/drain regions 212b results in formation of the NMOS active region 208a in the first semiconductor device region 606, the formation of the PMOS active region 208b in the second semiconductor device region 608, and the formation of the isolation region 210 in the transition region 610.

The NMOS active region 208a may be included between two or more NMOS source/drain regions 212a along the X-direction. The PMOS active region 208b may be included between two or more PMOS source/drain regions 212b along the X-direction. The isolation region 210 may be included between an NMOS source/drain region 212a and a PMOS source/drain region 212b along the X-direction. As further shown in FIG. 6E, the edges of the NMOS source/drain regions 212a and the PMOS source/drain regions 212b may be staggered or offset in the Y-direction along the X-direction in the top-down view of the semiconductor device 200. The stagger or offset may result from the asymmetric and/or curved shape of the isolation region 210.

As further shown in FIG. 6E, the isolation liners 612 are fully capped or contained by the spacer layers 234 and the dummy gate structures 614. The dummy gate structures 614 and the isolation liners 612 are fully isolated or separated from the NMOS source/drain regions 212a and from the PMOS source/drain regions 212b, which reduces the likelihood of merging between two or more source/drain regions of the semiconductor device 200.

Source/drain recesses may be formed in the nanosheet stack of the first layers 602 and the second layers 604 in an etch operation to form the NMOS active region 208a, the PMOS active region 208b, and the isolation region 210. The source/drain recesses are formed to provide spaces in which the NMOS source/drain regions 212a and the PMOS source/drain regions 212b are to be formed. The etch operation may be performed by the etch tool 108 and may be referred to a strained source/drain (SSD) etch operation. In some implementations, the etch operation includes a plasma etch technique, a wet chemical etch technique, and/or another type of etch technique.

The etch operation may also result in the formation of the mesa regions 204 under the NMOS active region 208a, the PMOS active region 208b, and the isolation region 210. In implementations in which the semiconductor substrate 202 includes a silicon (Si) material having a (100) orientation. Faces having a (111) orientation may be formed at bottoms of the source/drain recesses, resulting in formation of a V-shape or a triangular shape cross section at the bottoms of the source/drain recesses. In some implementations, a wet etching using tetramethylammonium hydroxide (TMAH) and/or a chemical dry etching using hydrochloric acid (HCl) are employed to form the V-shape profile. However, the cross section at the bottoms of the source/drain recesses may include other shapes, such as round or semi-circular, among other examples.

Inner spacers 224 may be formed on ends of the first layers 602 prior to formation of the NMOS source/drain regions 212a and the PMOS source/drain regions 212b in the source/drain recesses. The etch tool 108 may laterally etch the ends of the first layer 602 (e.g., in a direction that is approximately parallel to a length of the first layers 602) through the source/drain recesses to form cavities between end portions of the nanosheet layers of the NMOS active region 208a, the PMOS active region 208b, and the isolation region 210.

In implementations where the first layers 602 are silicon germanium (SiGe) and the second layers 604 are silicon (Si), the etch tool 108 may selectively etch the first layers 602 using a wet etchant such as, a mixed solution including hydrogen peroxide ($H_2O_2$), acetic acid ($CH_3COOH$), and/or hydrogen fluoride (HF), followed by cleaning with water ($H_2O$). The mixed solution and the water may be provided into the source/drain recesses to etch the first layers 602 from the source/drain recesses. In some embodiments, the etching by the mixed solution and cleaning by water is repeated approximately 10 to approximately 20 times. The etching time by the mixed solution is in a range from about 1 minute to about 2 minutes in some implementations. The mixed solution may be used at a temperature in a range of approximately 60° Celsius to approximately 90° Celsius. However, other values for the parameters of the etch operation are within the scope of the present disclosure.

The cavities in the ends of the first layers 602 may be formed to an approximately curved shape, an approximately concave shape, an approximately triangular shape, an approximately square shape, or to another shape. In some implementations, the depth of one or more of the cavities (e.g., the dimension of the cavities extending into the first layers 602 from the source/drain recesses) is in a range of approximately 0.5 nanometers to about 5 nanometers. In some implementations, the depth of one or more of the cavities is in a range of approximately 1 nanometer to approximately 3 nanometers. However, other values for the depth of the cavities are within the scope of the present disclosure.

An insulating layer may be is conformally deposited along the bottom and along the sidewalls of the source/drain recesses after the cavities in the ends of the first layers 602 are formed. The deposition tool 102 may deposit the insulating layer using a CVD technique, a PVD technique, and ALD technique, and/or another deposition technique. The deposition tool 102 forms the insulating layer to a thickness sufficient to fill in the cavities in the ends of the first layers 602. For example, the insulating layer may be formed to a thickness in a range of approximately 1 nanometer to approximately 10 nanometers. As another example, the insulating layer may be formed to a thickness in a range of approximately 2 nanometers to approximately 5 nanometers. However, other values for the thickness of the insulating layer are within the scope of the present disclosure. The insulating layer is partially removed such that remaining portions of the insulating layer correspond to the inner spacers 224 in the cavities. The etch tool 108 may perform an etch operation to partially remove the insulating layer.

In some implementations, the etch operation may result in the surfaces of the inner spacers 224 facing the source/drain recesses being curved or recessed. The depth of the recesses in the inner spacers 224 may be in a range of approximately 0.2 nanometers to approximately 3 nanometers. As another example, the depth of the recesses in the inner spacers 224 may be in a range of approximately 0.5 nanometers to approximately 2 nanometers. As another example, the depth of the recesses in the inner spacers 224 may be in a range of less than approximately 0.5 nanometers. In some implementations, the surfaces of the inner spacers 224 facing the source/drain recesses are approximately flat.

The source/drain recesses are then filled with one or more layers to form the NMOS source/drain regions 212a and the PMOS source/drain regions 212b in the source/drain recesses. In some implementations, the second semiconductor device region 608 is masked, and the source/drain recesses are formed in the first semiconductor device region 606 and the NMOS source/drain regions 212a are formed in the source/drain recesses while the second semiconductor device region 608 is masked. Then, the first semiconductor device region 606 is masked, and the source/drain recesses are formed in the second semiconductor device region 608 and the PMOS source/drain regions 212b are formed in the source/drain recesses while the first semiconductor device region 606 is masked. Alternatively, the PMOS source/drain regions 212b may be formed prior to formation of the NMOS source/drain regions 212a.

To deposit a source/drain region (e.g., an NMOS source/drain region 212a, a PMOS source/drain region 212b), the deposition tool 102 may deposit an epitaxial region 214 at the bottom of a source/drain recess, the deposition tool 102 may deposit a buffer layer 216 on the epitaxial region 214 and on ends of nanosheet layers in the source/drain recess (e.g., on ends of the nanosheet layers of the NMOS active region 208a, on ends of the nanosheet layers of the PMOS active region 208b, on ends of the nanosheet layers of the isolation region 210). The deposition tool 102 may then partially fill the source/drain recess with an epitaxial layer 218 over the inner spacers 224 and over the buffer layer 216, and may fill the remaining portion of the source/drain recess with an epitaxial layer 220 over the epitaxial layer 218.

The asymmetric and/or curved shape of the isolation region 210 increases the length of the first edge 302 of the isolation region and increases the length of the second edge 304 of the isolation region 210. The increased length of the first edge 302 between the connection region 308 and the connection region 310, and the increased length of the second edge 304 between the connection region 308 and the connection region 310, reduces a likelihood one or more layers (e.g., the buffer layer 216, the epitaxial layer 218) of the NMOS source/drain region 212a adjacent to the connection region 308 merging with one or more layers (e.g., the buffer layer 216, the epitaxial layer 218) of the PMOS source/drain region 212b adjacent to the connection region 310. In particular, the increased length of the first edge 302 reduces a likelihood that the one or more layers (e.g., the buffer layer 216, the epitaxial layer 218) of the NMOS source/drain region 212a adjacent to the connection region 308 and one or more layers (e.g., the buffer layer 216, the epitaxial layer 218) of the PMOS source/drain region 212b will grow along the first edge 302 and merge together along the first edge 302. Similarly, the increased length of the second edge 304 reduces a likelihood that the one or more layers (e.g., the buffer layer 216, the epitaxial layer 218) of the NMOS source/drain region 212a adjacent to the connection region 308 and one or more layers (e.g., the buffer layer 216, the epitaxial layer 218) of the PMOS source/drain region 212b will grow along the second edge 304 and merge together along the second edge 304.

Figure 6F:
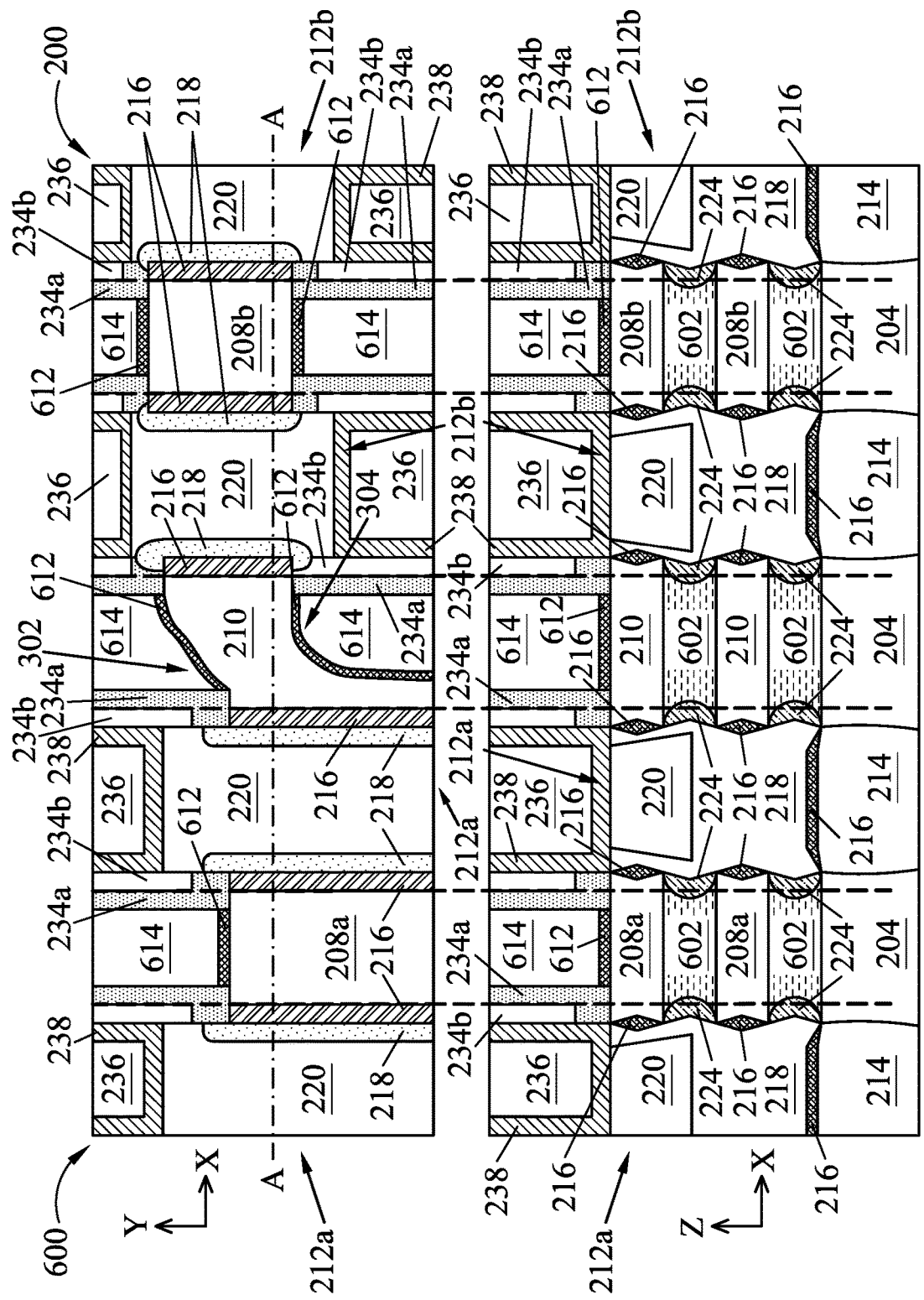

A top portion of FIG. 6F illustrates a top-down view of a portion of the semiconductor device, and a bottom portion of FIG. 6F illustrates a cross-section view of a portion of the semiconductor device 200 along the cross-sectional plane A-A in the top-down view (which corresponds to the cross-sectional plane A-A in FIG. 2). As shown in FIG. 6F, the ILD layer 236 and the contact etch stop layer 238 are formed over and around the source/drain regions, including over and around the NMOS source/drain regions 212a and over and around the PMOS source/drain region 212b. The ILD layer 236 and the contact etch stop layer 238 fill in areas between the dummy gate structures 614. The ILD layer 236 is formed to reduce the likelihood of and/or prevent damage to the source/drain regions during the replacement gate process.

The contact etch stop layer 238 may be conformally deposited (e.g., by the deposition tool 102) over and around the source/drain regions. The ILD layer 236 is then deposited (e.g., by the deposition tool 102) over the contact etch stop layer 238. In some implementations, the contact etch stop layer 238 and the ILD layer 236 are also formed over the dummy gate structures 614, and the planarization tool 110 performs a CMP operation and/or another type of planarization operation to remove the portions of the contact etch stop layer 238 and the portion of the ILD layer 236 from the dummy gate structures 614. The contact etch stop layer 238 may provide a mechanism to stop an etch process when forming contacts or vias for the source/drain regions. The contact etch stop layer 238 may be formed of a dielectric material having a different etch selectivity from adjacent layers or components. The contact etch stop layer 238 may include or may be a nitrogen containing material, a silicon containing material, and/or a carbon containing material. Furthermore, the contact etch stop layer 238 may include or may be silicon nitride ($Si_xN_y$), silicon carbon nitride (SiCN), carbon nitride (CN), silicon oxynitride (SiON), silicon carbon oxide (SiCO), or a combination thereof, among other examples. The contact etch stop layer 238 may be deposited using a deposition process, such as ALD, CVD, or another deposition technique.

As indicated above, FIGS. 6A-6F are provided as an example. Other examples may differ from what is described with regard to FIGS. 6A-6F.

Figure 7:
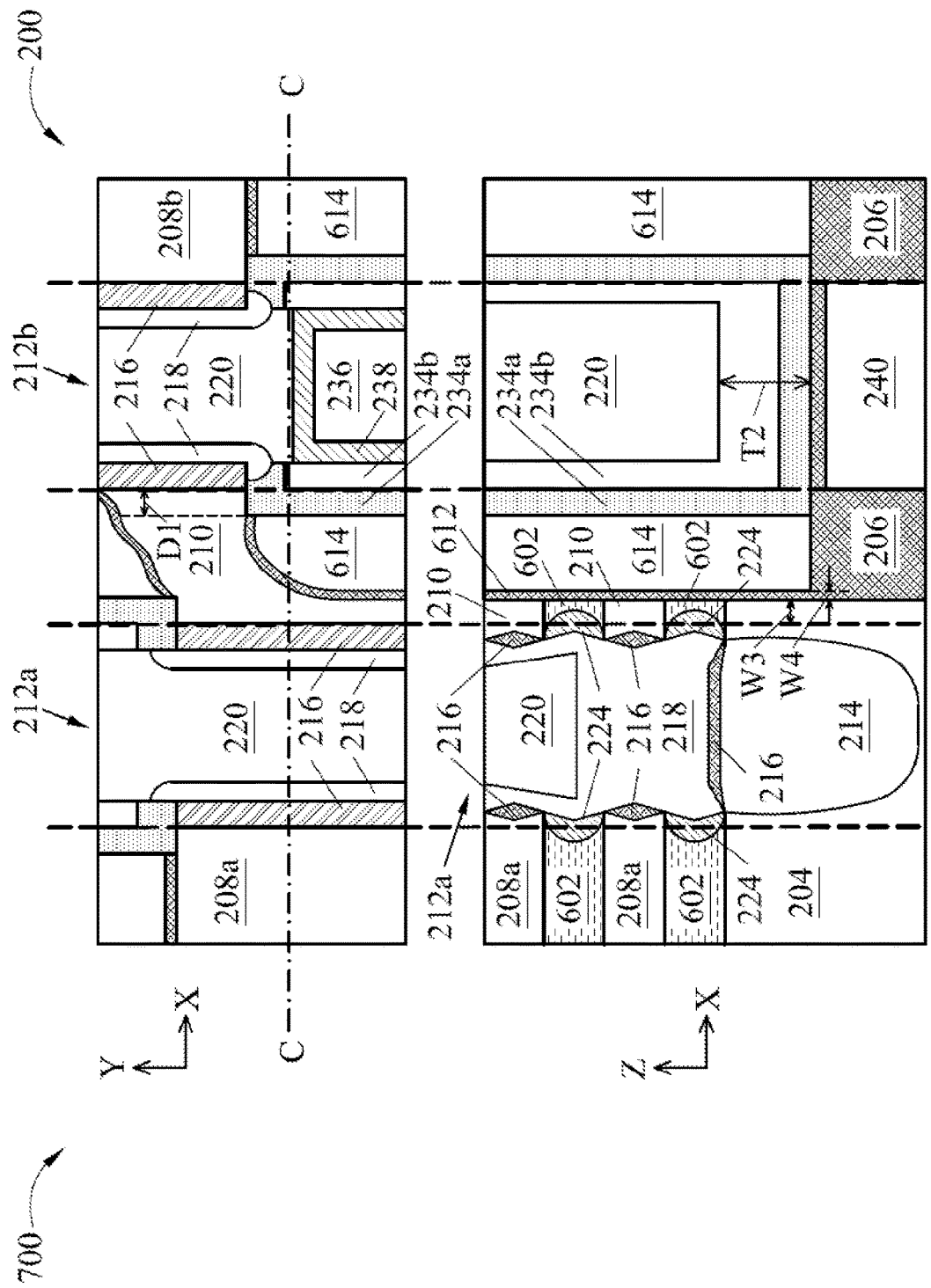
FIG. 7 is a diagram of an example implementation of a semiconductor device described herein.

FIG. 7 is a diagram of an example implementation 700 of the semiconductor device 200 described herein. A top portion of FIG. 7 illustrates a top-down view of a portion of the semiconductor device, and a bottom portion of FIG. 7 illustrates a cross-section view of a portion of the semiconductor device 200 along the cross-sectional plane C-C in the top-down view. The cross-sectional plane C-C is in the X-direction and is through a portion of the isolation region 210 that is adjacent to an associated dummy gate structure 614.

As shown in the cross-section view of FIG. 7, the isolation region 210 is adjacent to an NMOS source/drain region 212a and the dummy gate structure 614 on opposing sides of the isolation region 210. An isolation liner 612 is included between the dummy gate structure 614 and the isolation region 210. A width W4 of the isolation liner 612 between the dummy gate structure 614 and the isolation region 210 may be included in a range of approximately 2 nanometers to approximately 10 nanometers to reduce the likelihood of the first layers 602 extruding into the dummy gate structure 614 and to provide sufficient area for formation of the inner spacers 224. However, other values for the range are within the scope of the present disclosure.

The dummy gate structure 614 is adjacent to a portion of an epitaxial layer 220 of a PMOS source/drain region 212b that is above an STI region 206. The portion of the epitaxial layer 220 extends laterally outward from a buffer layer 216 and an epitaxial layer 218 of the PMOS source/drain region 212b in the Y-direction in the top-down view of the semiconductor device 200. The spacer layer(s) 234 are between the dummy gate structure 614 and the epitaxial layer 220.

Moreover, the spacer layer(s) 234 wrap around a bottom of the epitaxial layer 220 in the cross-section view of the semiconductor device 200. Thus, the spacer layer(s) 234 are included between the STI region 206 and the epitaxial layer 220 in the cross-section view. A top surface of the spacer layer(s) 234 below the epitaxial layer 220 may be at a greater height in the Z-direction in the semiconductor device 200 relative to a height of the top surface of the epitaxial region 214. A thickness T2 of the spacer layer(s) 234 between the STI region 206 and the epitaxial layer 220 may be included in a range of approximately 5 nanometers to approximately 35 nanometers to reduce the likelihood of extrusion of the epitaxial layer 220 into the dummy gate structure 614 and to achieve sufficient growth of the epitaxial layer 220. However, other values for the range are within the scope of the present disclosure.

As indicated above, FIG. 7 is provided as an example. Other examples may differ from what is described with regard to FIG. 7.

Figure 8A:
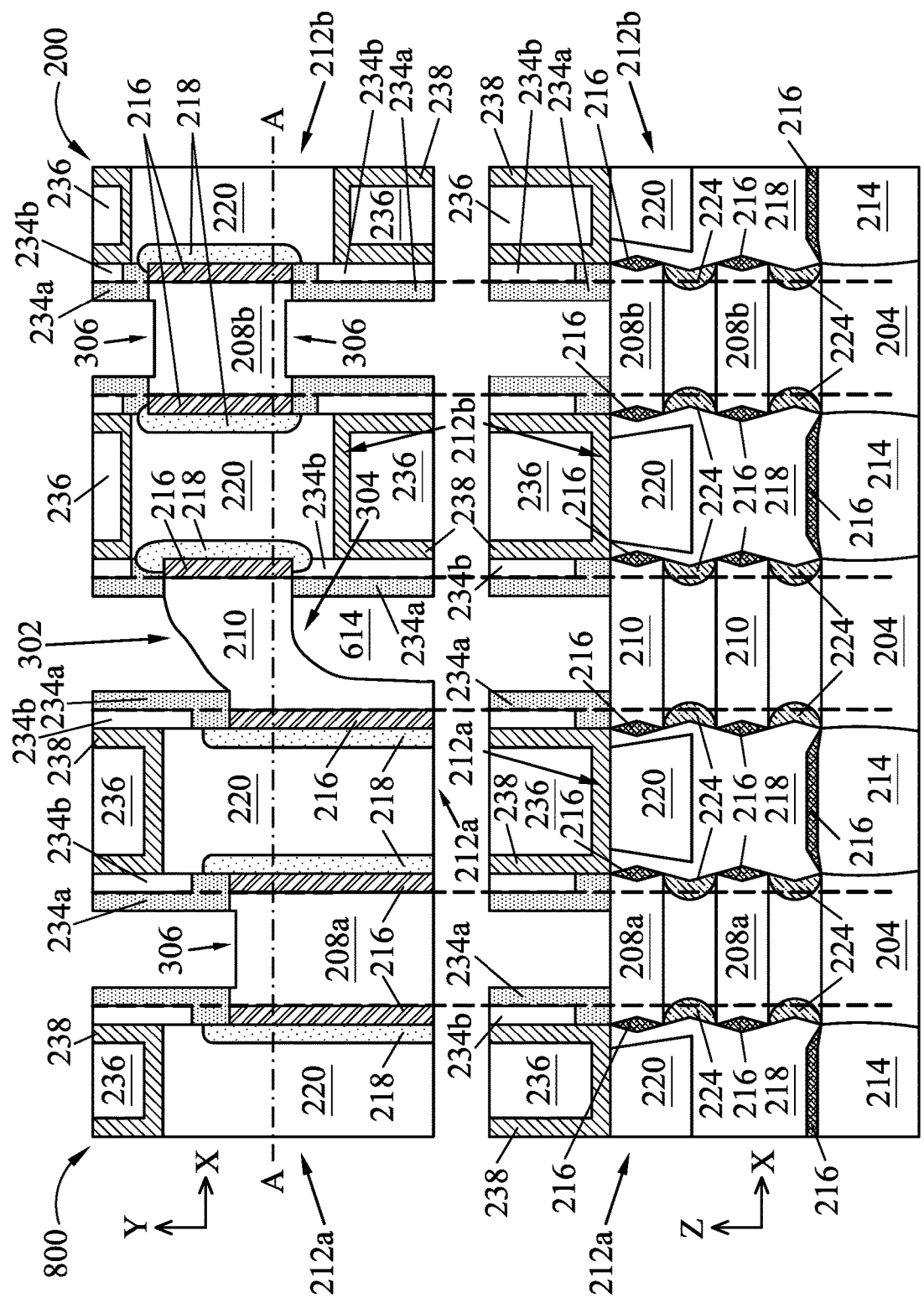
FIGS. 8A and 8B are diagrams of an example implementation described herein.
Figure 8B:
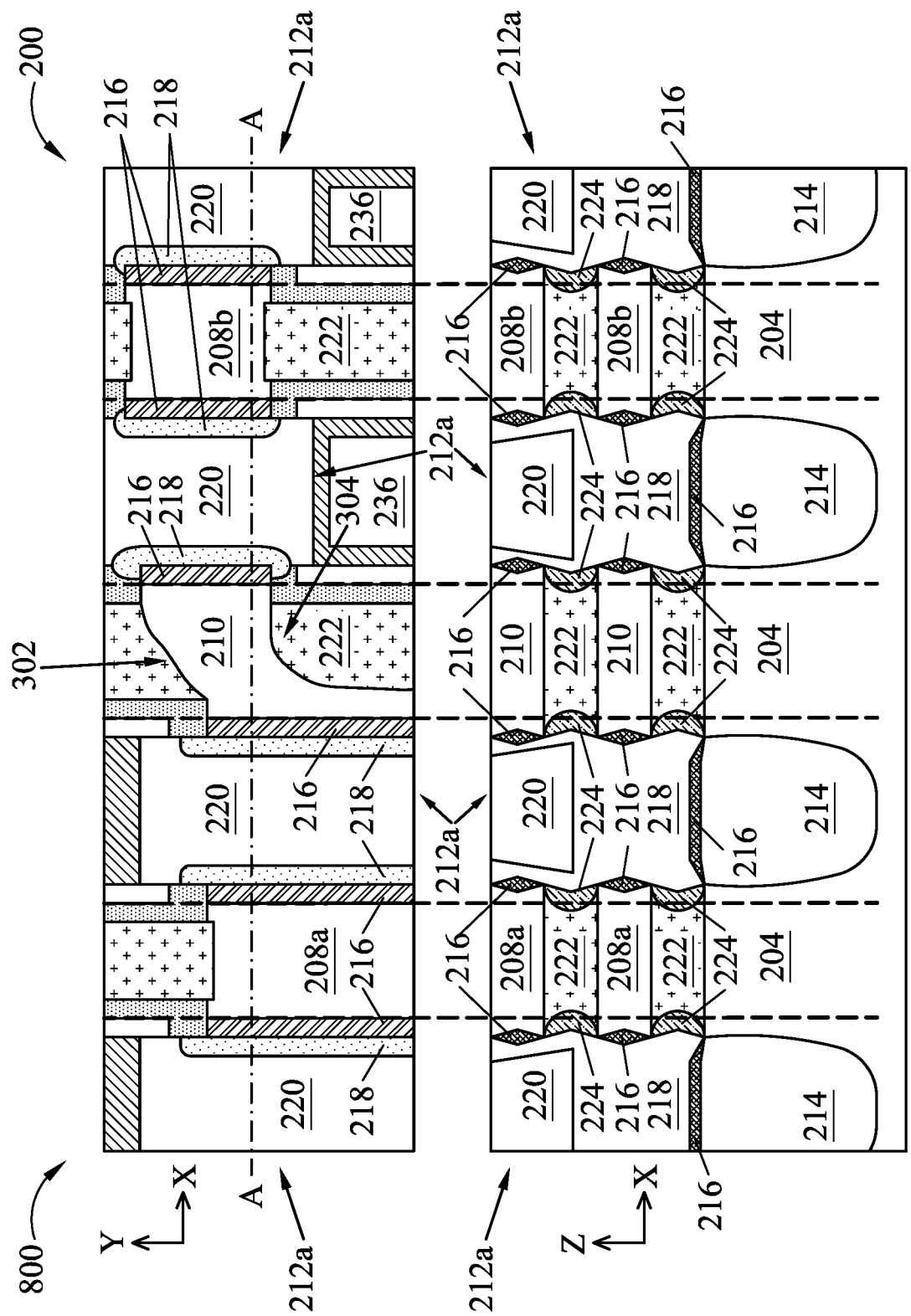

FIGS. 8A and 8B are diagrams of an example implementation 800 described herein. The example implementation 800 includes an example of a replacement gate process for replacing the dummy gate structures 614 with the gate structures 222 (e.g., the replacement gate structures) of the semiconductor device 200. In some implementations, the operations described in connection with the example implementation 800 are performed after the operations described in connection with FIGS. 6A-6F.

A top portion of FIG. 8A illustrates a top-down view of a portion of the semiconductor device, and a bottom portion of FIG. 8A illustrates a cross-section view of a portion of the semiconductor device 200 along the cross-sectional plane A-A in the top-down view (which corresponds to the cross-sectional plane A-A in FIG. 2). As shown in FIG. 8A, the replacement gate operation is performed (e.g., by one or more of the semiconductor processing tools 102-112) to remove the dummy gate structures 614 and the isolation liners 612 from the semiconductor device 200. The removal of the dummy gate structures 614 leaves behind openings (or recesses) between the ILD layer 236 over the source/drain regions. The removal of the isolation liners 612, leaves behind recesses 306 in the sidewalls of the nanosheet layers of the NMOS active region 208a, in the sidewalls of the nanosheet layers of the PMOS active region 208b, and/or in the sidewalls of the nanosheet layers of the isolation region 210. The dummy gate structures 614 and the isolation liners 612 may be removed in one or more etch operations that are performed by the etch tool 108. Such etch operations may include a plasma etch technique, a wet chemical etch technique, and/or another type of etch technique.

As further shown in FIG. 8A, a nanostructure release operation (e.g., an SiGe release operation) is performed to remove the first layers 602 (e.g., the silicon germanium layers). This results in openings between the nanosheet layers (e.g., the areas around the nanosheet layers) of the NMOS active region 208a, of the PMOS active region 208b, and of the isolation region 210. The nanostructure release operation may include the etch tool 108 performing an etch operation to remove the first layer 602 based on a difference in etch selectivity between the material of the first layers 602 and the material of the nanosheet layers of the NMOS active region 208a, of the PMOS active region 208b, and of the isolation region 210, and between the material of the first layers 602 and the material of the inner spacers 224. The inner spacers 224 may function as etch stop layers in the etch operation to protect the source/drain regions from being etched.

A top portion of FIG. 8B illustrates a top-down view of a portion of the semiconductor device, and a bottom portion of FIG. 8B illustrates a cross-section view of a portion of the semiconductor device 200 along the cross-sectional plane A-A in the top-down view (which corresponds to the cross-sectional plane A-A in FIG. 2). As shown in FIG. 8B, the replacement gate operation continues, where the deposition tool 102 and/or the plating tool 112 forms the gate structures 222 (e.g., replacement gate structures) in the openings between the source/drain regions and between the ILD layer 236. In particular, the gate structures 222 fill the areas between and around the nanosheet layers (or nanostructure channels) that were previously occupied by the first layers 602 such that the gate structures 222 fully wrap around the nanosheet layers (or nanostructure channels) and surround the nanosheet layers (or nanostructure channels). The gate structures 222 may include metal gate structures. A conformal high-k dielectric liner may be deposited prior to formation of the gate structures 222. The gate structures 222 may include additional layers such as an interfacial layer, a work function tuning layer, a metal electrode structure, another layer described in connection with FIG. 2, and/or another layer, among other examples.

As indicated above, FIGS. 8A and 8B are provided as an example. Other examples may differ from what is described with regard to FIGS. 8A and 8B.

Figure 9:
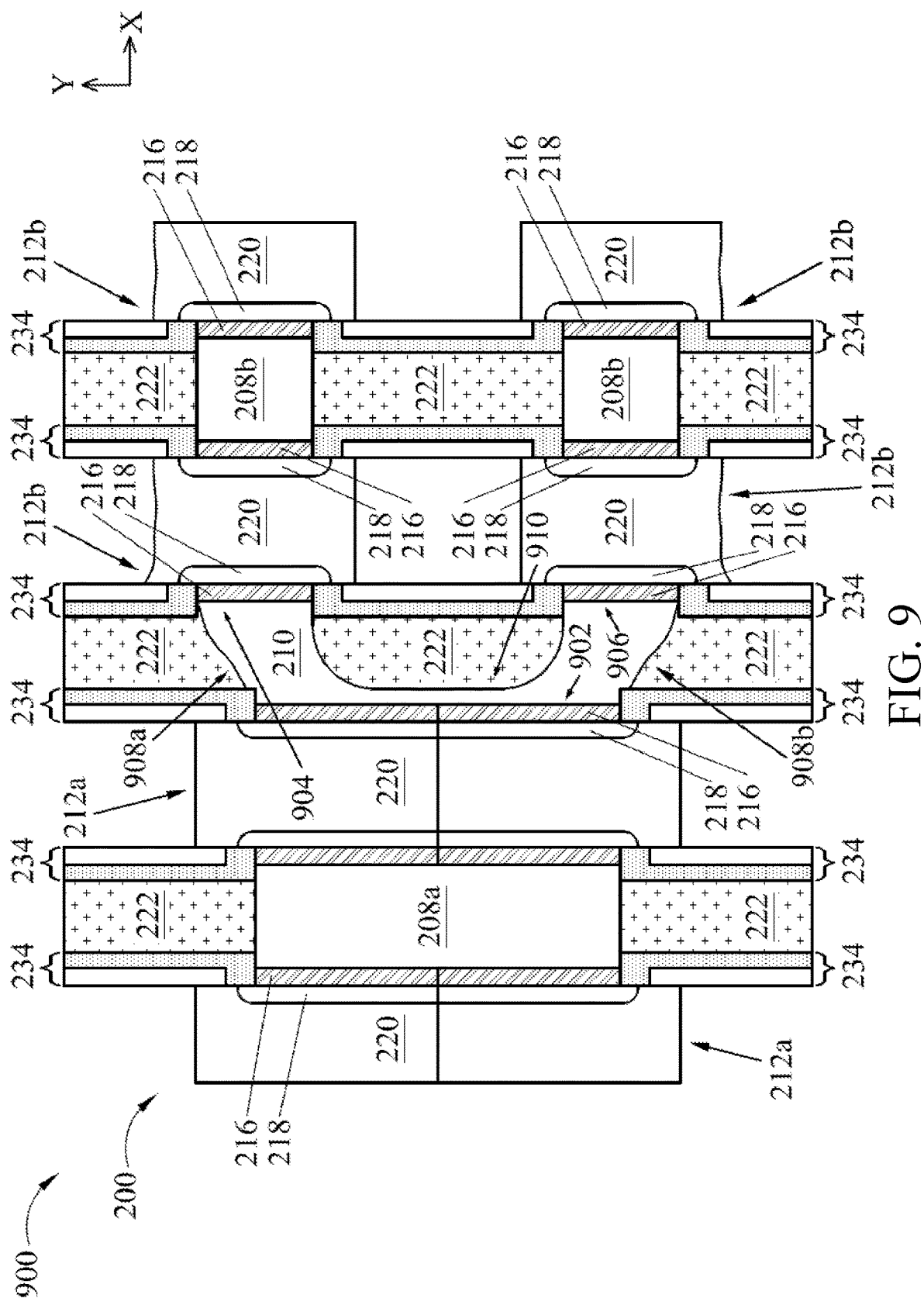
FIG. 9 is a diagram of an example implementation of a semiconductor device described herein.

FIG. 9 is a diagram of an example implementation 900 of the semiconductor device 200 described herein. The semiconductor device 200 in the example implementation 900 may include a similar configuration and/or arrangement of structures as shown in FIG. 2. However, in the example implementation 900, the isolation region 210 of the semiconductor device 200 is connected with a plurality of PMOS source/drain regions 212b.

As shown in FIG. 9, the semiconductor device 200 may include an NMOS source/drain region 212a adjacent to a connection region 902 of the isolation region 210. The NMOS source/drain region 212a may be located between the connection region 902 and an NMOS active region 208a.

As further shown in FIG. 9, the semiconductor device 200 may include a first PMOS source/drain region 212b adjacent to a connection region 904 of the isolation region 210 opposing the connection region 902. A first PMOS active region 208b may be located adjacent to the first PMOS source/drain region 212b such that the first PMOS source/drain region 212b is between the connection region 904 and the first PMOS active region 208b.

A second PMOS source/drain region 212b may be located adjacent to a connection region 906 of the isolation region 210, also opposing the connection region 902. A second PMOS active region 208b may be located adjacent to the second PMOS source/drain region 212b such that the second PMOS source/drain region 212b is between the connection region 906 and the second PMOS active region 208b.

In some implementations, the connection region 904 and the connection region 906 are approximately parallel and aligned in the Y-direction of the semiconductor device 200. In some implementations, the connection region 904 and the connection region 906 are not aligned in the Y-direction of the semiconductor device 200.

As further shown in FIG. 9, the outside edges 908a and 908b of the isolation region 210 are curved between the connection region 902 and the connection region 904, and between the connection region 902 and the connection region 906, respectively. Moreover, an inside edge 910 of the isolation region 210 may be continuous between the connection regions 904 and 906. The inside edge 910 may be curved in an approximately U-shaped manner.

The curvature of the isolation region 210 described above may reduce the likelihood of merging between the NMOS source/drain region 212a adjacent to the isolation region 210 and a plurality of PMOS source/drain regions 212b adjacent to the isolation region 210. In particular, the curvature of the outside edges 908a and 908b, and the curvature of the inside edge 910, may increase the distance between the connection region 902 and the connection regions 904 and 906. The increased distance between the connection region 902 and the connection regions 904 and 906 reduces the likelihood that one or more layers of the NMOS source/drain region 212a will merge with one or more of the plurality of PMOS source/drain regions 212b along the outside edges 908a and 908b and/or along the inside edge 910.

As indicated above, FIG. 9 is provided as an example. Other examples may differ from what is described with regard to FIG. 9.

Figure 10:
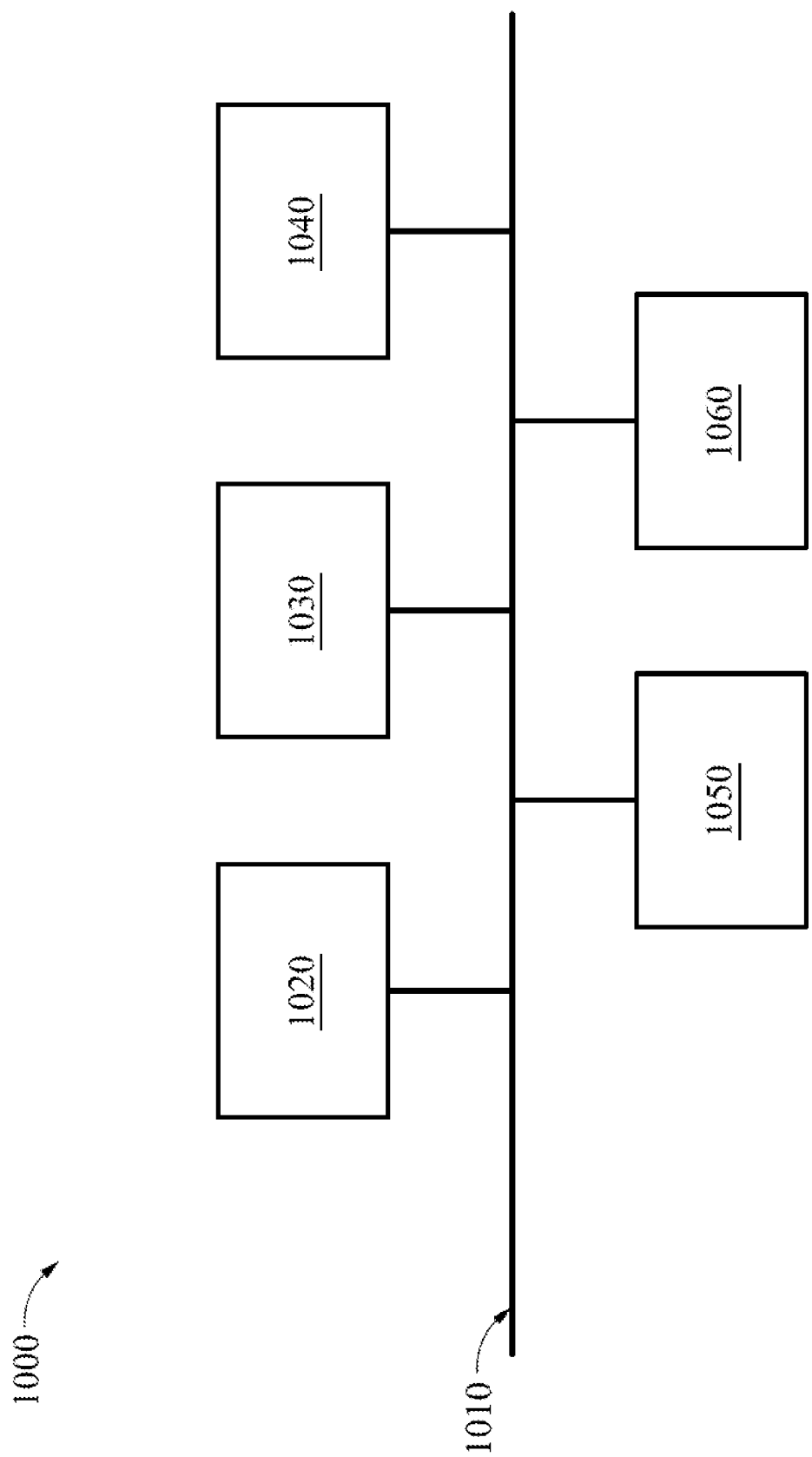
FIG. 10 is a diagram of example components of a device described herein.

FIG. 10 is a diagram of example components of a device 1000 described herein. In some implementations, one or more of the semiconductor processing tools 102-112 and/or the wafer/die transport tool 114 may include one or more devices 1000 and/or one or more components of device 1000. As shown in FIG. 10, device 1000 may include a bus 1010, a processor 1020, a memory 1030, an input component 1040, an output component 1050, and a communication component 1060.

Bus 1010 includes one or more components that enable wired and/or wireless communication among the components of device 1000. Bus 1010 may couple together two or more components of FIG. 10, such as via operative coupling, communicative coupling, electronic coupling, and/or electric coupling. Processor 1020 includes a central processing unit, a graphics processing unit, a microprocessor, a controller, a microcontroller, a digital signal processor, a field-programmable gate array, an application-specific integrated circuit, and/or another type of processing component. Processor 1020 is implemented in hardware, firmware, or a combination of hardware and software. In some implementations, processor 1020 includes one or more processors capable of being programmed to perform one or more operations or processes described elsewhere herein.

Memory 1030 includes volatile and/or nonvolatile memory. For example, memory 1030 may include random access memory (RAM), read only memory (ROM), a hard disk drive, and/or another type of memory (e.g., a flash memory, a magnetic memory, and/or an optical memory). Memory 1030 may include internal memory (e.g., RAM, ROM, or a hard disk drive) and/or removable memory (e.g., removable via a universal serial bus connection). Memory 1030 may be a non-transitory computer-readable medium. Memory 1030 stores information, instructions, and/or software (e.g., one or more software applications) related to the operation of device 1000. In some implementations, memory 1030 includes one or more memories that are coupled to one or more processors (e.g., processor 1020), such as via bus 1010.

Input component 1040 enables device 1000 to receive input, such as user input and/or sensed input. For example, input component 1040 may include a touch screen, a keyboard, a keypad, a mouse, a button, a microphone, a switch, a sensor, a global positioning system sensor, an accelerometer, a gyroscope, and/or an actuator. Output component 1050 enables device 1000 to provide output, such as via a display, a speaker, and/or a light-emitting diode. Communication component 1060 enables device 1000 to communicate with other devices via a wired connection and/or a wireless connection. For example, communication component 1060 may include a receiver, a transmitter, a transceiver, a modem, a network interface card, and/or an antenna.

Device 1000 may perform one or more operations or processes described herein. For example, a non-transitory computer-readable medium (e.g., memory 1030) may store a set of instructions (e.g., one or more instructions or code) for execution by processor 1020. Processor 1020 may execute the set of instructions to perform one or more operations or processes described herein. In some implementations, execution of the set of instructions, by one or more processors 1020, causes the one or more processors 1020 and/or the device 1000 to perform one or more operations or processes described herein. In some implementations, hardwired circuitry is used instead of or in combination with the instructions to perform one or more operations or processes described herein. Additionally, or alternatively, processor 1020 may be configured to perform one or more operations or processes described herein. Thus, implementations described herein are not limited to any specific combination of hardware circuitry and software.

The number and arrangement of components shown in FIG. 10 are provided as an example. Device 1000 may include additional components, fewer components, different components, or differently arranged components than those shown in FIG. 10. Additionally, or alternatively, a set of components (e.g., one or more components) of device 1000 may perform one or more functions described as being performed by another set of components of device 1000.

Figure 11:
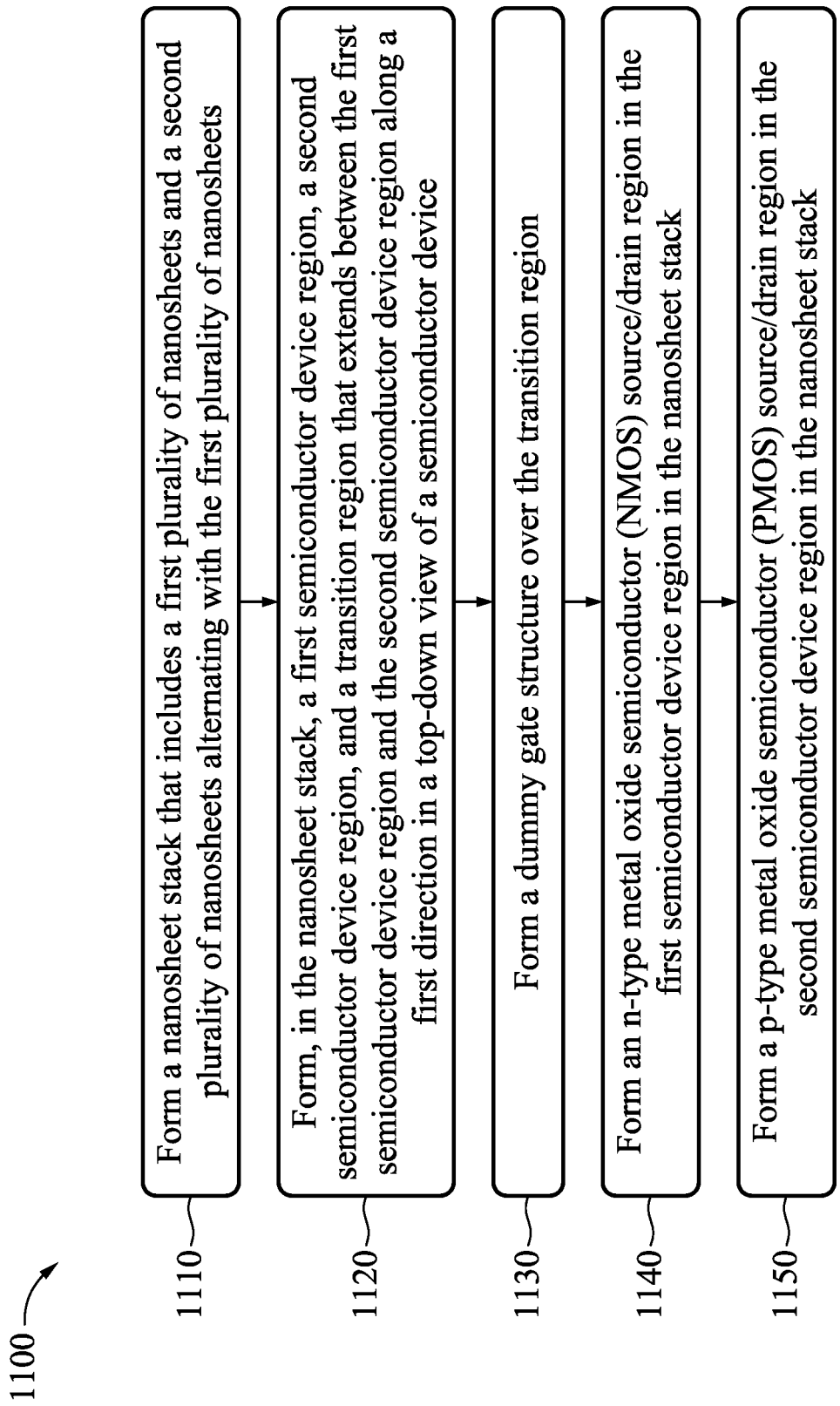
FIG. 11 is a flowchart of an example process associated with forming a semiconductor device.

FIG. 11 is a flowchart of an example process 1100 associated with forming a semiconductor device. In some implementations, one or more process blocks of FIG. 11 are performed by one or more semiconductor processing tools (e.g., one or more of the semiconductor processing tools 102-112). Additionally, or alternatively, one or more process blocks of FIG. 11 may be performed by one or more components of device 1000, such as processor 1020, memory 1030, input component 1040, output component 1050, and/or communication component 1060.

As shown in FIG. 11, process 1100 may include forming a nanosheet stack that includes a first plurality of nanosheets and a second plurality of nanosheets alternating with the first plurality of nanosheets (block 1110). For example, one or more of the semiconductor processing tools 102-112 may form a nanosheet stack that includes a first plurality of nanosheets (e.g., first layers 602) and a second plurality of nanosheets (e.g., second layers 604) alternating with the first plurality of nanosheets, as described above.

As further shown in FIG. 11, process 1100 may include forming, in the nanosheet stack, a first semiconductor device region, a second semiconductor device region, and a transition region that extends between the first semiconductor device region and the second semiconductor device region along a first direction in a top-down view of a semiconductor device (block 1120). For example, one or more of the semiconductor processing tools 102-112 may form, in the nanosheet stack, a first semiconductor device region 606, a second semiconductor device region 608, and a transition region 610 that extends between the first semiconductor device region 606 and the second semiconductor device region 608 along a first direction (e.g., in the X-direction) in a top-down view of a semiconductor device 200, as described above. In some implementations, the first and second semiconductor device regions 606 and 608 are staggered along a second direction (e.g., the Y-direction), in a top-down view of the semiconductor device 200, that is approximately perpendicular with the first direction (e.g., the X-direction).

As further shown in FIG. 11, process 1100 may include forming a dummy gate structure over the transition region (block 1130). For example, one or more of the semiconductor processing tools 102-112 may form a dummy gate structure 614 over the transition region 610, as described above.

As further shown in FIG. 11, process 1100 may include forming an NMOS source/drain region in the first semiconductor device region in the nanosheet stack (block 1140). For example, one or more of the semiconductor processing tools 102-112 may form an NMOS source/drain region 212a in the first semiconductor device region 606 in the nanosheet stack, as described above.

As further shown in FIG. 11, process 1100 may include forming a PMOS source/drain region in the second semiconductor device region in the nanosheet stack (block 1150). For example, one or more of the semiconductor processing tools 102-112 may form a PMOS source/drain region 212b in the second semiconductor device region 608 in the nanosheet stack, as described above.

Process 1100 may include additional implementations, such as any single implementation or any combination of implementations described below and/or in connection with one or more other processes described elsewhere herein.

In a first implementation, forming the NMOS source/drain region 212a includes forming the NMOS source/drain region 212a, adjacent to a first connection region 308 of the transition region 610, and forming the PMOS source/drain region 212b includes forming the PMOS source/drain region 212b adjacent to a second connection region 310 of the transition region 610 opposing the first connection region 308. In a second implementation, alone or in combination with the first implementation, process 1100 includes forming an isolation liner 612 on sidewalls of the transition region 610 between the first connection region 308 and the second connection region 310, and forming the dummy gate structure 614 includes forming the dummy gate structure 614 on the isolation liner 612 over the sidewalls of the transition region.

In a third implementation, alone or in combination with one or more of the first and second implementations, process 1100 includes forming a first spacer layer 234 on a first side of the dummy gate structure 614, and forming a second spacer layer 234 on a second side of the dummy gate structure 614 opposing the first side, the first spacer layer 234 is adjacent to the first connection region 308, and the second spacer layer 234 is adjacent to the second connection region 310. In a fourth implementation, alone or in combination with one or more of the first through third implementations, the first spacer layer 234 is fully covered by the dummy gate structure 614 and by the isolation liner 612 next to the first connection region 308, and the second spacer layer 234 is fully covered by the dummy gate structure 614 and by the isolation liner 612 next to the second connection region 310.

In a fifth implementation, alone or in combination with one or more of the first through fourth implementations, the NMOS source/drain region 212a includes a buffer layer 216 adjacent to the first connection region 308, a first epitaxial layer 220, and a second epitaxial layer 218 between the buffer layer 216 and the first epitaxial layer 220, where a length of the buffer layer 216 and a length of the first connection region 308 are approximately a same length.

Although FIG. 11 shows example blocks of process 1100, in some implementations, process 1100 includes additional blocks, fewer blocks, different blocks, or differently arranged blocks than those depicted in FIG. 11. Additionally, or alternatively, two or more of the blocks of process 1100 may be performed in parallel.

In this way, nanostructure transistors may be formed in a manner that may reduce the likelihood of source/drain region merging in the nanostructure transistors. In a top-down view of a nanostructure transistor described herein, source/drain regions on opposing sides of a nanostructure channel of the nanostructure transistor are staggered such that the distance between the source/drain regions is increased. This reduces the likelihood of the source/drain regions merging, which reduces the likelihood of failures and/or other defects forming in the nanostructure transistor. Accordingly, staggering the source/drain regions, as described herein, may facilitate the miniaturization of semiconductor devices that include nanostructure transistors while maintaining and/or increasing the semiconductor device yield of the semiconductor devices.

As described in greater detail above, some implementations described herein provide a semiconductor device. The semiconductor device includes a plurality of channel layers arranged in a first direction over a semiconductor substrate. The semiconductor device includes a gate structure wrapping around each of the plurality of channel layers. The semiconductor device includes a first source/drain region adjacent to a first side of the plurality of channel layers. The semiconductor device includes a second source/drain region adjacent to a second side of the plurality of channel layers that opposes the first side in a second direction that is approximately perpendicular with the first direction, where, in a top-down view of the semiconductor device, the first side and the second side are offset by a distance, in a third direction in the semiconductor device that is approximately perpendicular with the first direction and the second direction.

As described in greater detail above, some implementations described herein provide a semiconductor device. The semiconductor device includes an NMOS active region comprising a first plurality of nanosheet layers over a semiconductor substrate. The semiconductor device includes a PMOS active region 208b comprising a second plurality of nanosheet layers over the semiconductor substrate. The semiconductor device includes an isolation region, between the NMOS active region and the PMOS active region, comprising a third plurality of nanosheet layers over the semiconductor substrate. The semiconductor device includes respective gate structures wrapping around each of the first plurality of nanosheet layers, the second plurality of nanosheet layers, and the third plurality of nanosheet layers, where, in a top-down view of the semiconductor device, the third plurality of nanosheet layers are curved between the NMOS region and the PMOS region.

As described in greater detail above, some implementations described herein provide a method. The method includes forming a nanosheet stack that includes a first plurality of nanosheets and a second plurality of nanosheets alternating with the first plurality of nanosheets. The method includes forming, in the nanosheet stack, a first semiconductor device region, a second semiconductor device region, and a transition region that extends between the first semiconductor device region and the second semiconductor device region along a first direction in a top-down view of a semiconductor device where the first and second semiconductor device regions are staggered along a second direction, in a top-down view of the semiconductor device, that is approximately perpendicular with the first direction. The method includes forming a dummy gate structure over the transition region. The method includes forming an NMOS source/drain region in the first semiconductor device region in the nanosheet stack. The method includes forming a PMOS source/drain region in the second semiconductor device region in the nanosheet stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a plurality of channel layers arranged in a first direction over a semiconductor substrate;
    a gate structure wrapping around each of the plurality of channel layers;
    a first source/drain region adjacent to a first side of the plurality of channel layers; and
    a second source/drain region adjacent to a second side of the plurality of channel layers that opposes the first side in a second direction that is approximately perpendicular with the first direction,
        wherein, in a top-down view of the semiconductor device, the first side and the second side are offset by a distance, in a third direction in the semiconductor device that is approximately perpendicular with the first direction and the second direction,
        wherein, in the top-down view of the semiconductor device, a first edge of the plurality of channel layers is curved between the first side and the second side.

2. The semiconductor device of claim 1, wherein, in the top-down view of the semiconductor device, a length of the first source/drain region along the third direction is greater relative to a length of the second source/drain region along the third direction;
    wherein the first source/drain region comprises an n-type metal oxide semiconductor (NMOS) source/drain region; and
    wherein the second source/drain region comprises a p-type metal oxide semiconductor (PMOS) source/drain region.

3. The semiconductor device of claim 1, wherein, in the top-down view of the semiconductor device, a first edge of the first source/drain region and a second edge of the second source/drain region are approximately parallel and are not aligned along the second direction.

4. The semiconductor device of claim 1,
    wherein, in the top-down view of the semiconductor device, a second edge of the plurality of channel layers opposing the first edge is curved between the first side and the second side.

5. The semiconductor device of claim 4, wherein, a first amount of curvature of the first edge is greater relative to a second amount of curvature of the second edge.

6. The semiconductor device of claim 4, wherein, in the top-down view of the semiconductor device, a length of the plurality of channel layers between a top of a curve of the second edge and a bottom of the curve of the second edge is lesser relative to a length of the first side.

7. The semiconductor device of claim 4, wherein, in the top-down view of the semiconductor device, a length of the plurality of channel layers between a top of a curve of the first edge and a bottom of the curve of the first edge is greater relative to a length of the second side.

8. A semiconductor device, comprising:
a n-type metal oxide semiconductor (NMOS) active region comprising a first plurality of nanosheet layers over a semiconductor substrate;
a p-type metal oxide semiconductor (PMOS) active region comprising a second plurality of nanosheet layers over the semiconductor substrate;
an isolation region, between the NMOS active region and the PMOS active region, comprising a third plurality of nanosheet layers over the semiconductor substrate; and
respective gate structures wrapping around each of the first plurality of nanosheet layers, the second plurality of nanosheet layers, and the third plurality of nanosheet layers,
wherein, in a top-down view of the semiconductor device, the third plurality of nanosheet layers are curved between the NMOS active region and the PMOS active region.

9. The semiconductor device of claim 8, wherein, in the top-down view of the semiconductor device, a length of the NMOS active region is greater relative to a length of the PMOS active region.

10. The semiconductor device of claim 8, wherein, in a first cross-section view along a first direction that is approximately perpendicular to a second direction along which the respective gate structures extend, the isolation region is side-by-side with a NMOS source/drain region of the semiconductor device and a PMOS source/drain region of the semiconductor device; and
wherein, in a second cross-section view along the first direction, the isolation region is side-by-side with the NMOS source/drain region and a gate structure, of the respective gate structures of the semiconductor device, that wraps around the third plurality of nanosheet layers.

11. The semiconductor device of claim 10, wherein, in the first cross-section view along the first direction, the NMOS source/drain region is between the isolation region and the NMOS active region; and
wherein, in the first cross-section view along the first direction, the PMOS source/drain region is between the isolation region and the PMOS active region.

12. The semiconductor device of claim 10, wherein, in the second cross-section view along the first direction, the NMOS source/drain region is between the isolation region and the NMOS active region; and
wherein, in the second cross-section view along the first direction, the gate structure is between the isolation region and an interlayer dielectric (ILD) layer that is adjacent to the PMOS source/drain region along the second direction.

13. The semiconductor device of claim 8, wherein, in the top-down view of the semiconductor device, at least one of the NMOS active region or the PMOS active region includes recesses on opposing sides of the at least one of the NMOS active region or the PMOS active region.

14. The semiconductor device of claim 8, further comprising:

an NMOS source/drain region adjacent to a first connection region of the isolation region,
wherein the NMOS source/drain region is between the first connection region and the NMOS active region;
a first PMOS source/drain region adjacent to a second connection region of the isolation region opposing the first connection region,
wherein the PMOS active region comprises a first PMOS active region that is adjacent to the first PMOS source/drain region, and
wherein the first PMOS source/drain region is between the second connection region and the first PMOS active region;
a second PMOS source/drain region adjacent to a third connection region of the isolation region opposing the first connection region; and
a second PMOS active region,
wherein the second PMOS source/drain region is between the third connection region and the second PMOS active region.

15. A semiconductor device, comprising:
a first source/drain region over a semiconductor substrate;
a second source/drain region over the semiconductor substrate;
a plurality of channel layers, over the semiconductor substrate, between the first source/drain region and the second source/drain region in a first direction,
wherein, in a top-down view of the semiconductor device, a first edge of the plurality of channel layers is curved between a side of the first source/drain region and a side of the second source/drain region; and
a respective gate structure wrapping around each of the plurality of channel layers.

16. The semiconductor device of claim 15, wherein, in the top-down view of the semiconductor device, a length of the first source/drain region along a second direction is greater than a length of the second source/drain region along the second direction.

17. The semiconductor device of claim 15, wherein, in the top-down view of the semiconductor device, a second edge of the plurality of channel layers, having a curvature greater than a curvature of the first edge, is curved between the side of the first source/drain region and the side of the second source/drain region.

18. The semiconductor device of claim 15, further comprising:
a first active region adjacent to the first source/drain region; and
a second active region adjacent to the second source/drain region.

19. The semiconductor device of claim 18, further comprising:
a first isolation region, wherein the first source/drain region is between the first active region and the first isolation region; and
a second isolation region, wherein the second source/drain region is between the second active region and the second isolation region.

20. The semiconductor device of claim 15, wherein, in the top-down view of the semiconductor device, the first source/drain region and the second source/drain region are offset by a distance in a second direction that is approximately perpendicular with the first direction.

* * * * *